(12) United States Patent
Choi et al.

(10) Patent No.: US 12,550,536 B2
(45) Date of Patent: Feb. 10, 2026

(54) ORGANIC LIGHT-EMITTING DISPLAY DEVICE AND METHOD FOR MANUFACTURING THE SAME

(71) Applicant: LG Display Co., Ltd., Seoul (KR)

(72) Inventors: Hyeju Choi, Iksan-si (KR); Miso Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 566 days.

(21) Appl. No.: 17/939,839

(22) Filed: Sep. 7, 2022

(65) Prior Publication Data
US 2023/0080568 A1  Mar. 16, 2023

(30) Foreign Application Priority Data
Sep. 13, 2021 (KR) ........................ 10-2021-0121553

(51) Int. Cl.
*H10K 59/122* (2023.01)
*H10K 50/84* (2023.01)
*H10K 59/12* (2023.01)
*H10K 71/00* (2023.01)

(52) U.S. Cl.
CPC ......... *H10K 59/122* (2023.02); *H10K 50/841* (2023.02); *H10K 71/00* (2023.02); *H10K 59/1201* (2023.02)

(58) Field of Classification Search
None
See application file for complete search history.

(56) References Cited

U.S. PATENT DOCUMENTS

| | | | |
|---|---|---|---|
| 10,403,853 B2* | 9/2019 | Choung | H10K 50/15 |
| 2018/0315806 A1* | 11/2018 | Lee | H10K 59/35 |
| 2020/0185648 A1* | 6/2020 | Choi | H10K 50/8445 |

FOREIGN PATENT DOCUMENTS

| | | | |
|---|---|---|---|
| KR | 10-2010-0024871 A | 3/2010 |
| KR | 10-2010-0055235 A | 5/2010 |
| KR | 10-2015-0061076 A | 6/2015 |
| KR | 10-2021-0069331 A | 6/2021 |
| KR | 10-2021-0075674 A | 6/2021 |

OTHER PUBLICATIONS

Korean Intellectual Property Office, Notice of Allowance, Korean Patent Application No. 10-2021-0121553, Dec. 31, 2025, six pages.

* cited by examiner

*Primary Examiner* — Michelle Mandala
(74) *Attorney, Agent, or Firm* — Fenwick & West LLP

(57) ABSTRACT

An organic light-emitting display device and a method for manufacturing the same are disclosed. The organic light-emitting display device includes a driving thin-film transistor on a substrate; an insulating film covering the driving thin-film transistor except for a portion thereof; a planarization layer disposed on the insulating film and having a pixel contact hole defined therein exposing a portion of a surface of an electrode; a first electrode disposed on the planarization layer and extending on an inner surface of the pixel contact hole so as to connect to the transistor via the electrode; a bank disposed on the planarization layer so as to define a light-emitting area of a pixel; a plurality of pixel patterns disposed on the first electrode; a protective pattern filling the pixel contact hole and having a trench-shaped space; and a photoresist plug pattern filling the trench-shaped space.

12 Claims, 26 Drawing Sheets

ORGANIC LIGHT-EMITTING DISPLAY DEVICE AND METHOD FOR MANUFACTURING THE SAME

CROSS-REFERENCE TO RELATED APPLICATION

This application claims priority from Korean Patent Application No. 10-2021-0121553 filed on Sep. 13, 2021 in the Korean Intellectual Property Office, and all the benefits accruing therefrom under 35 U.S.C. 119, the contents of which in its entirety are herein incorporated by reference.

BACKGROUND

Field

The present disclosure relates to an organic light-emitting display device, and more particularly, to an organic light-emitting display device and a method for manufacturing the same in which outgassing is reduced or suppressed to reduce luminance degradation, thereby improving lifespan of the device.

Description of Related Art

An organic light-emitting display device includes a self-emissive element in which the element itself emits light. In the organic light-emitting display device, a time for which the device converts an electrical signal to light is short, and the generated light spreads out uniformly without directionality. The organic light-emitting display device has advantages of excellent color rendering, large viewing angle, high contrast ratio, and fast response speed, and thus may be manufactured into an ideal display for realizing high-definition video. Further, the organic light-emitting display device has an overall small thickness, and thus may be manufactured into a display thinner than a liquid crystal display device (LCD), or a plasma display device (PDP), and thus is being developed as a large-area, high-definition next-generation display device.

However, light-emission performance of the organic light-emitting display device may deteriorate as use time of the organic light-emitting display device increases. One of various causes of deterioration of the light-emission performance is an outgassing phenomenon.

When gaseous compounds generated from the outgassing phenomenon comes into contact with an organic light-emitting part made of an organic material and reacts therewith, the compounds may damage the organic light-emitting part and reduce the luminance of the device, which in turn shortens the lifespan of the organic light-emitting display device.

SUMMARY

In order to manufacture an organic light-emitting display device, a plurality of patterning processes are performed. Plasma treatment is performed between a previous patterning process and a subsequent patterning process. Plasma treatment is performed to remove foreign substances or residues generated in a process of performing the previous patterning process. However, efficiency and lifespan of the organic light-emitting display device are lowered due to outgassing induced in the process of the plasma treatment.

Outgassing is a phenomenon in which a gas compound is generated in the process of the plasma treatment, and the generated gas compound is discharged to an outside.

When a bank has been made of an organic material, the outgassing may occur from the bank during a subsequent plurality of patterning processes. The generated gaseous compounds may reduce luminance of an organic light-emitting element, thereby reducing the lifetime of the organic light-emitting display device.

A purpose of the present disclosure is to solve the above problem and thus is to provide an organic light-emitting display device in which an outgassing phenomenon is prevented from occurring or reduced during a plasma treatment process, thereby improving a lifespan of an organic light-emitting element.

Further, a purpose of the present disclosure is to provide a method for manufacturing an organic light-emitting display device in which plasma treatment is performed while a protective layer is covered with a photoresist film, such that an outgassing phenomenon is prevented from occurring or reduced during a plasma treatment process, thereby improving a lifespan of an organic light-emitting element.

Further, a purpose of the present disclosure is to provide an organic light-emitting display device in which a bank is made of an inorganic material instead of an organic material, such that outgassing from the organic material is suppressed to prevent deterioration of the luminance of the organic light-emitting element.

Purposes of the present disclosure are not limited to the above-mentioned purpose. Other purposes and advantages of the present disclosure that are not mentioned may be understood based on following descriptions, and may be more clearly understood based on embodiments of the present disclosure. Further, it will be easily understood that the purposes and advantages of the present disclosure may be realized using means shown in the claims and combinations thereof.

One aspect of the present disclosure provides an organic light-emitting display device comprising: a substrate; a driving thin-film transistor disposed on the substrate and including a source electrode and a drain electrode; an insulating film disposed on the driving thin-film transistor and receiving therein a first contact hole, wherein the drain electrode fills the first contact hole; a planarization layer disposed on the insulating film and receiving therein a second contact hole exposing a portion of the drain electrode; a first electrode disposed on the planarization layer, wherein the first electrode is connected to the drain electrode; a bank disposed on the planarization layer so as to define a light-emitting area of each pixel; a plurality of pixel patterns respectively disposed on the first electrode; and a sealing portion including: a protective pattern partially filling an inner space of the second contact hole; and an island pattern disposed on a top portion of the protective pattern.

In one implementation of the device, the device further comprises: a second electrode commonly connected to the plurality of pixel patterns and covering an exposed top surface of the sealing portion; and an encapsulation layer formed on the second electrode.

In one implementation of the device, the bank further includes a bank thin-film, wherein the bank thin-film is disposed between the sealing portion and a portion of the first electrode extending along and on the sidewall and the bottom of the second contact hole, wherein the bank thin-film is composed of an inorganic insulating film.

In one implementation of the device, the bank is composed of an inorganic insulating film including silicon oxide or silicon nitride.

In one implementation of the device, the protective pattern includes a polymer material containing a substantial amount of fluorine (F) based on a carbon-carbon double bond so as to have orthogonality.

In one implementation of the device, the pixel patterns include a first pixel pattern, a second pixel pattern and a third pixel pattern for emitting light beams of red, green, and blue colors, respectively.

In one implementation of the device, the protective pattern has a groove having a concave shape defined in the top portion thereof while partially filling both sidewalls and bottom portions of the second contact hole, wherein the island pattern fills the groove and has a plug shape.

In one implementation of the device, an outer side surface of the island pattern is surrounded with the protective pattern.

In one implementation of the device, the island pattern includes a photoresist material.

In one implementation of the device, a top surface of the sealing portion has a vertical level lower than a vertical level of a top surface of the bank.

In one implementation of the device, a top surface of the bank is coplanar with a top surface of the pixel pattern.

Another aspect of the present disclosure provides a method for manufacturing an organic light-emitting display device, the method comprising: forming a driving thin-film transistor including an source electrode and an drain electrode on a substrate; forming an insulating film including first contact holes on the driving thin-film transistor such that first contact holes respectively filled with the source electrode and the drain electrode; forming a planarization layer on the insulating film such that a second contact hole exposing a portion of the drain electrode is defined in the planarization layer; forming a first electrode on the planarization layer such that the first electrode extends along the second contact hole and then is connected to the drain electrode; forming a bank on the planarization layer so as to define a light-emitting area of each pixel; forming a protective layer over an entire surface of the substrate including the first electrode; forming a photoresist pattern on the protective layer so as to fill an entirety of the second contact hole and so as to be absent in an area in which a pixel pattern is to be formed; etching the protective layer using the photoresist pattern as an etch mask such that the first electrode is exposed in the area where the pixel pattern is to be formed; performing plasma treatment on an exposed surface of the first electrode; forming the pixel pattern on the exposed surface of the first electrode subjected to the plasma treatment; and performing a lift-off process of removing the protective layer and the photoresist pattern to form a sealing portion filling an inner space of the second contact hole at least partially.

In one implementation of the method, forming the sealing portion includes forming the sealing portion such that the sealing portion includes: a protective pattern partially filling both sidewalls and bottom portions of the inner space of the second contact hole and having a concave-shaped groove defined in a top portion thereof; and an island pattern filling the groove, wherein an outer side surface is surrounded with the protective pattern.

In one implementation of the method, the method further comprises: after performing the lift-off process, forming a second electrode over an entirety of the substrate so as to be connected to the pixel pattern; and forming an encapsulation layer on the second electrode.

In one implementation of the method, the pixel pattern includes one of a first pixel pattern, a second pixel pattern, and a third pixel pattern emitting light beams of red, green, and blue colors, respectively.

In one implementation of the method, the island pattern is formed in a plug shape.

In one implementation of the method, the protective layer is made of a polymer material containing a substantial amount of fluorine (F) based on a carbon-carbon double bond so as to have orthogonality.

In one implementation of the method, performing the plasma treatment is performed while an exposed surface of the protective layer except for the area where the pixel pattern is to be formed, and the second contact hole are covered with the photoresist pattern.

In one implementation of the method, the lift-off process is performed using a fluorine (F)-based organic solvent.

In one implementation of the method, forming the bank includes forming a bank thin-film made of an inorganic insulating film on and along a portion of the first electrode extending along and on the sidewall and the bottom of the second contact hole.

According to an embodiment of the present disclosure, the outgassing phenomenon in which the gas compound is generated during the plasma treatment performed in the process of performing the plurality of patterning processes may be reduced or prevented, thereby improving the performance and lifespan of the organic light-emitting display device.

Further, according to an embodiment of the present disclosure, the protective layer having the orthogonality to prevent damage to the organic light-emitting layer during the process steps may be introduced to protect the organic light-emitting layer such that the lifespan of the emitting display device may be improved.

Further, the plasma treatment is performed while the protective layer having orthogonality is covered with the photoresist film, thereby preventing the outgassing phenomenon from occurring, thereby improving the lifespan of the organic light-emitting element.

Further, according to an embodiment of the present disclosure, the bank is made of an inorganic material, thereby further preventing the outgassing phenomenon occurring when the bank is made of an organic material from occurring.

Further, according to an embodiment of the present disclosure, the bank is made of an inorganic material, thereby preventing damage to the bank in the dry etching process.

In addition, according to an embodiment of the present disclosure, the bank is made of an inorganic material. Thus, the bank may have a relatively smaller thickness than that when the bank is made of an organic material. Thus, the organic light-emitting display device may be slimmed Effects of the present disclosure are not limited to the above-mentioned effects, and other effects as not mentioned will be clearly understood by those skilled in the art from following descriptions.

DETAILED DESCRIPTIONS

Figure 1:
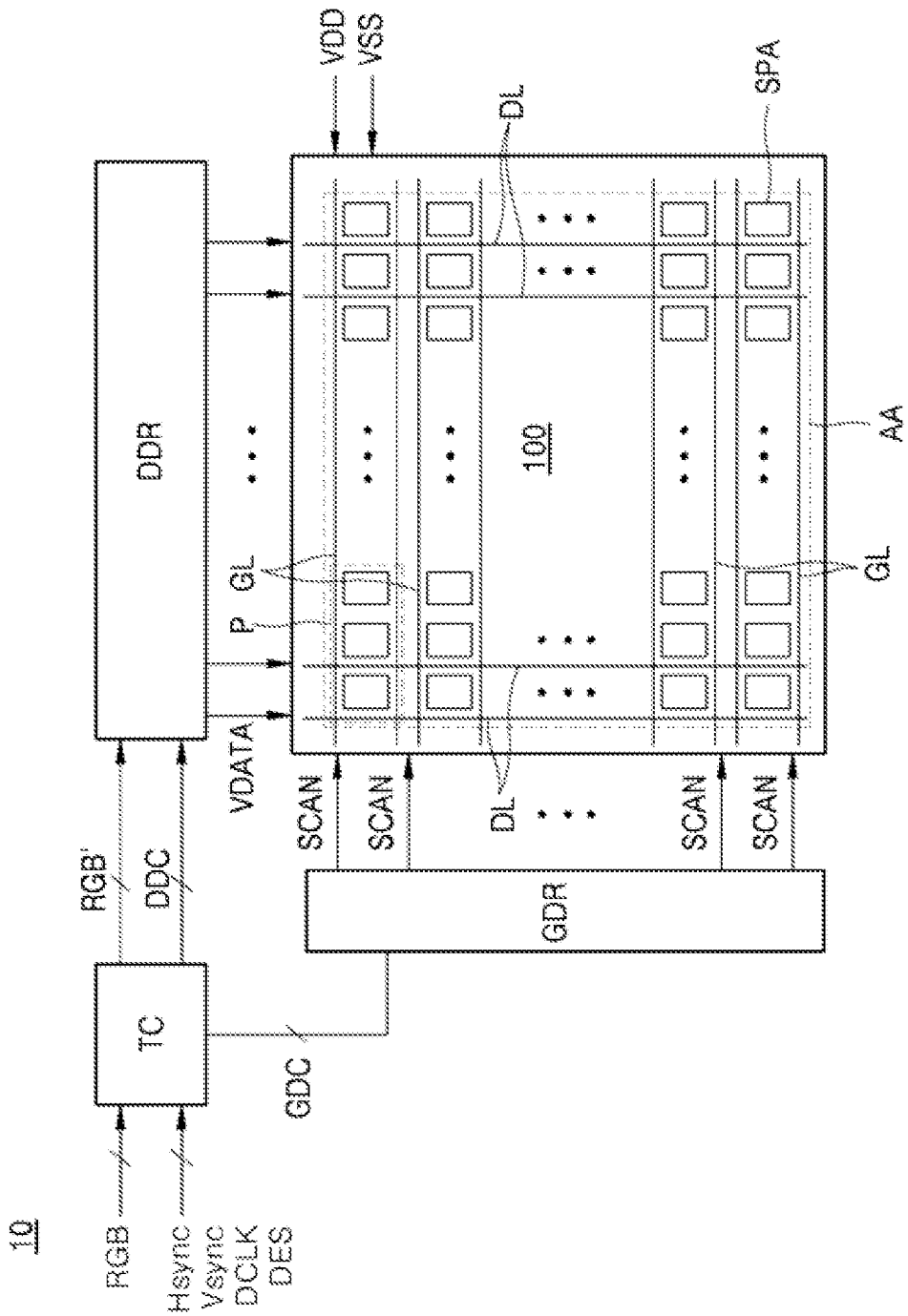
FIG. 1 is a diagram showing an organic light-emitting display device and drivers thereof according to an embodiment of the present disclosure.

Advantages and features of the present disclosure, and a method of achieving the advantages and features will become apparent with reference to embodiments described later in detail together with the accompanying drawings. However, the present disclosure is not limited to embodiments as disclosed below, but may be implemented in various different forms. Thus, these embodiments are set forth only to make the present disclosure complete, and to completely inform the scope of the present disclosure to those of ordinary skill in the technical field to which the present disclosure belongs, and the present disclosure is only defined by the scope of the claims.

A shape, a size, a ratio, an angle, a number, etc. disclosed in the drawings for describing the embodiments of the present disclosure are illustrative, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify an entirety of list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element or layer may be disposed directly on the second element or layer or may be disposed indirectly on the second element or layer with a third element or layer being disposed between the first and second elements or layers. It will be understood that when an element or layer is referred to as being "connected to", or "coupled to" another element or layer, it may be directly connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In interpreting a numerical value, the value is interpreted as including an error range unless there is no separate explicit description thereof.

The features of the various embodiments of the present disclosure may be partially or entirely combined with each other, and may be technically associated with each other or operate with each other. The embodiments may be implemented independently of each other and may be implemented together in an association relationship.

In descriptions of temporal relationships, for example, temporal precedent relationships between two events such as "after", "subsequent to", "before", etc., another event may occur therebetween unless "directly after", "directly subsequent" or "directly before" is indicated.

In one implementation of the invention, the expression "a substantial amount of fluorine" may mean that the number of fluorine atoms amounts up to 50% or more, or 60%, 70%, 80%, or 90% or more of the total number of the atoms of a molecule, a polymer, a material or a functional group.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, with reference to the drawings, there is described an organic light-emitting display device and a method for manufacturing the same according to an embodiment of the present disclosure in which an outgassing phenomenon is reduced or suppressed to reduce a luminance degradation rate over time, thereby improving a lifespan of the device.

Figure 2:
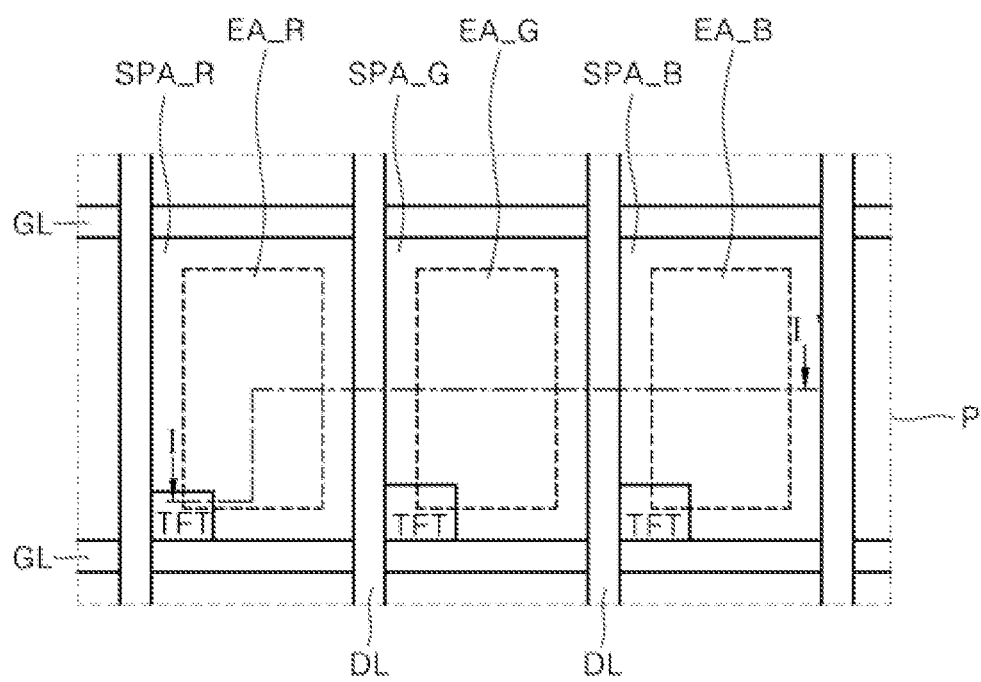
FIG. 2 is an enlarged plan view showing a 'P' area of a display area shown in FIG. 1.

FIG. 1 is a diagram showing an organic light-emitting display device 10 and drivers thereof according to an embodiment of the present disclosure. FIG. 2 is an enlarged plan view showing a area of a display area shown in FIG. 1.

Referring to FIG. 1 and FIG. 2, a display panel 100 includes a display area AA from which light for image display is output, a plurality of sub-pixel areas SPA disposed in the display area AA, and signal lines GL and DL connected to the plurality of sub-pixel areas SPA. The signal lines GL and DL of the display panel 100 transmit driving signals supplied from panel drivers TC, GDR, and DDR to each sub-pixel area SPA.

When the display panel 100 displays a color image, the plurality of sub-pixel areas SPA emit light beams having wavelength regions corresponding to a plurality of different colors, respectively. In this regard, the plurality of colors may include red, green and blue. Alternatively, the plurality of colors may further include white.

Specifically, referring to FIG. 2, the sub-pixel area SPA may be defined by two gate lines GL extending parallel to each other and a data line DL intersecting therewith. For example, the sub-pixel areas SPA may include a red sub-pixel area SPA_R, a green sub-pixel area SPA_G, and a blue sub-pixel area SPA_B. The red sub-pixel area SPA_R, the blue sub-pixel area SPA_B, and the green sub-pixel area SPA_G include a red light-emitting area EA_R, a blue light-emitting area EA_B and a green light-emitting area EA_G, respectively.

Each sub-pixel area SPA may include a driving thin-film transistor TFT. An arrangement order of the sub-pixel areas and a type and the number of signal lines extending across the pixel areas may be modified as needed.

The signal lines GL and DL of the display panel 100 may include the gate line GL transmitting a scan signal SCAN of a gate driver GDR, and the data line DL transmitting a data signal VDATA of a data driver DDR.

When the display panel 100 includes a light-emitting element (not shown) corresponding to each sub-pixel area SPA, the display panel 100 may further include first and second driving power lines for transmitting first and second driving powers VDD and VSS for driving the light-emitting element.

The panel drivers TC, GDR, and DDR may include the gate driver GDR connected to the gate line GL of the display panel 100, the data driver DDR connected to the data line DL of the display panel 100, and a timing controller TC that controls operation timings of the gate driver GDR, and the data driver DDR.

The timing controller TC rearranges digital video data RGB input from an external device based on a resolution of the display panel 100, and supplies the rearranged digital video data RGB' to the data driver DDR.

The timing controller TC supplies a data control signal DDC for controlling the operation timing of the data driver DDR, and a gate control signal GDC for controlling the operation timing of the gate driver GDR, based on timing signals such as a vertical synchronization signal Vsync, a horizontal synchronization signal Hsync, a dot clock signal DCLK, and a data enable signal DES.

The gate driver GDR sequentially supplies the scan signal SCAN to a plurality of gate lines GL for one frame period for image display based on the gate control signal GDC. That is, the gate driver GDR supplies the scan signal SCAN to each gate line GL for each horizontal period corresponding to each gate line GL for one frame period. In this regard, the gate line GL may correspond to sub-pixel areas SPA disposed in a horizontal direction among the plurality of sub-pixel areas SPA.

The data driver DDR converts the rearranged digital video data RGB' into analog data voltage based on the data control signal DDC. The data driver DDR supplies the data signal VDATA corresponding to each of the sub-pixel areas SPA corresponding to each gate line GL to the data line DL for each horizontal period, based on the rearranged digital video data RGB'.

Figure 3A:
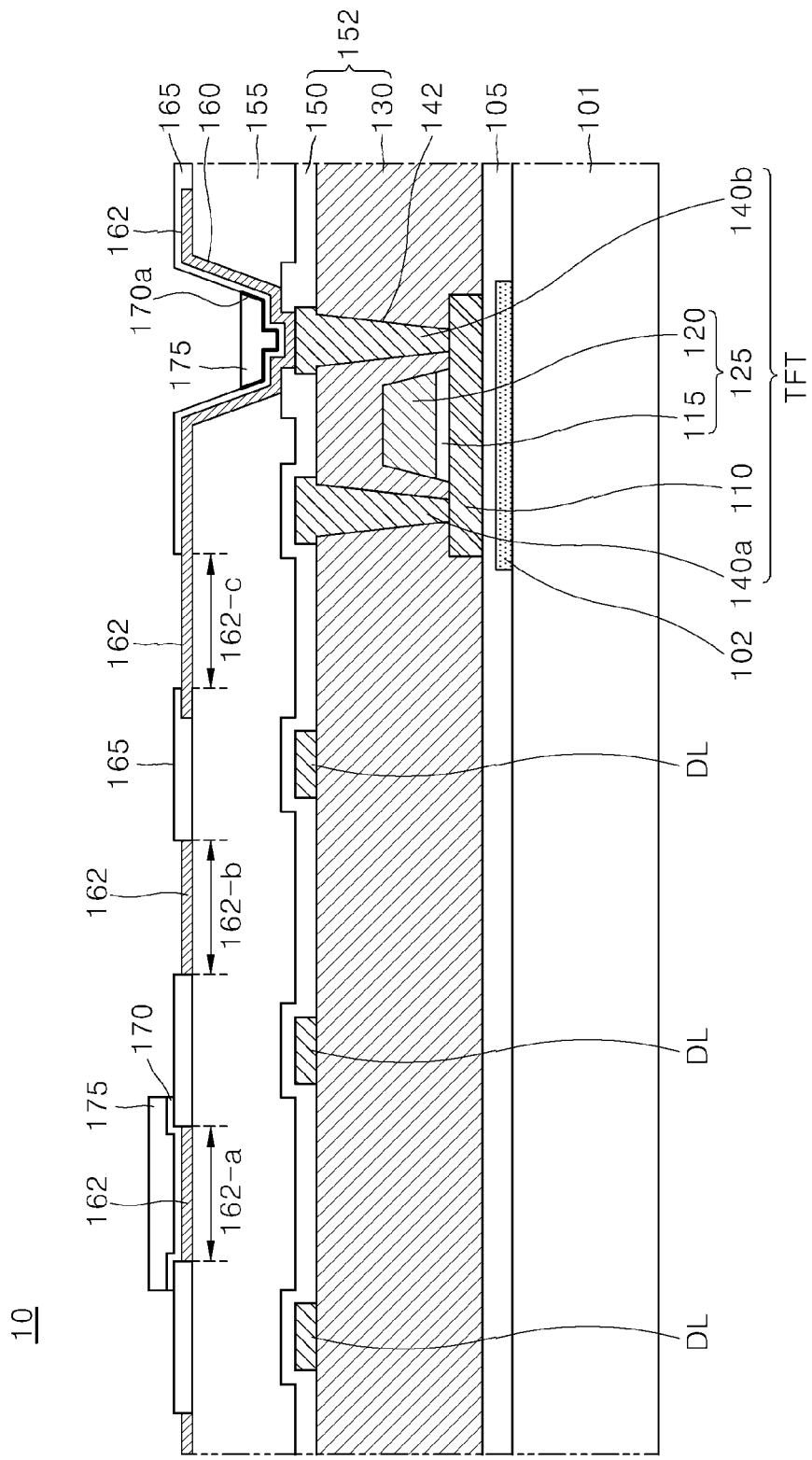
FIG. 3A and FIG. 3B are cross-sectional views showing FIG. 2 as cut along I-I' to illustrate an organic light-emitting display device according to an embodiment of the present disclosure.
Figure 3B:
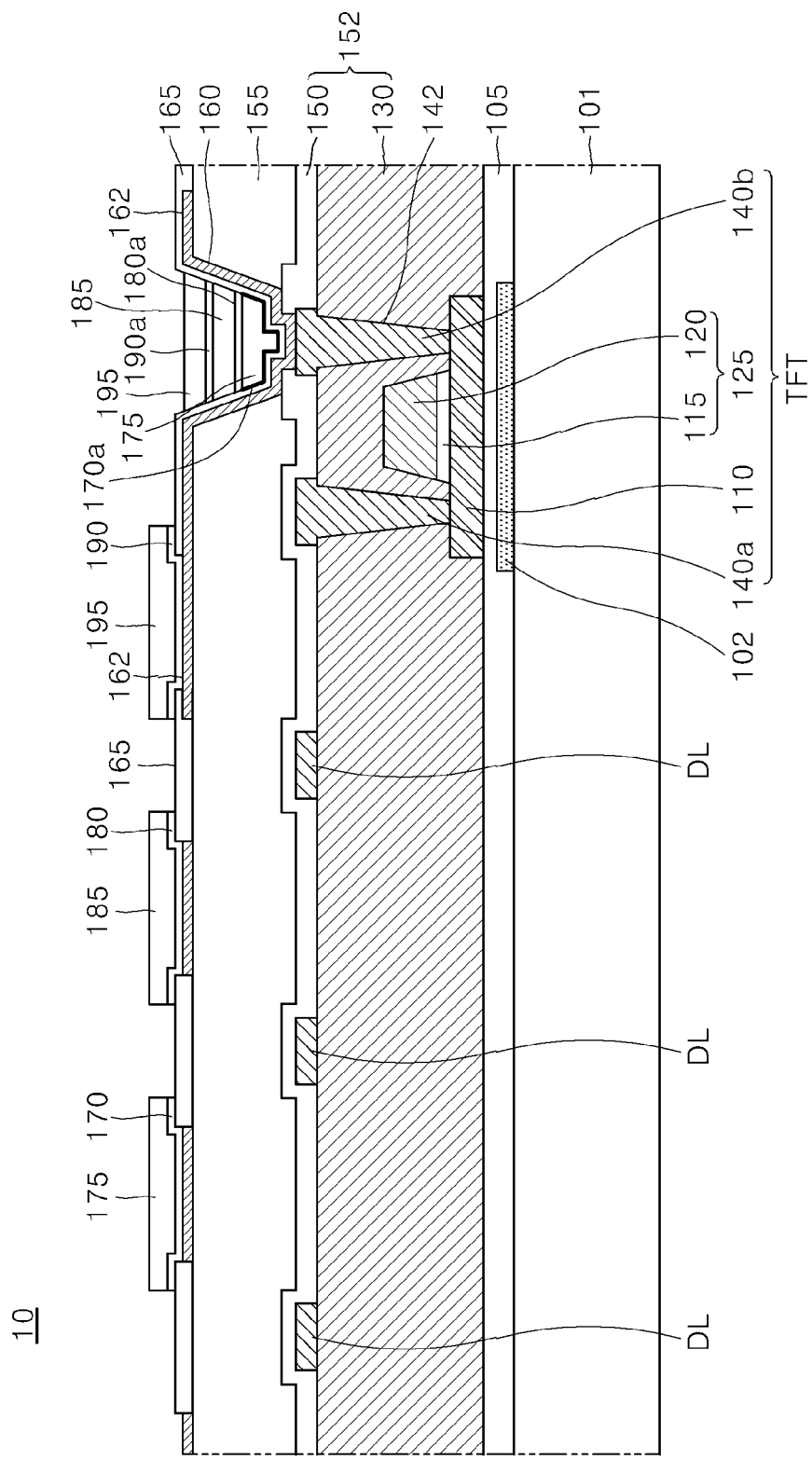

FIG. 3A and FIG. 3B are cross-sectional views showing FIG. 2 as cut along I-I' to illustrate an organic light-emitting display device according to an embodiment of the present disclosure. In this regard, FIG. 3A and FIG. 3B are diagrams for illustrating a process of forming a plurality of pixel patterns constituting the organic light-emitting display device.

Referring to FIG. 3A and FIG. 3B, an organic light-emitting display device 10 according to an embodiment of the present disclosure may include a light-blocking layer 102, a buffer layer 105, a driving thin-film transistor TFT, an interlayer insulating film 130, a passivation film 150, a planarization layer 155, a bank 165, a first electrode 162, a first pixel pattern 170, and a first protective pattern 175.

The light-blocking layer 102 may be disposed on the substrate 101 so as to overlap the driving thin-film transistor TFT. The buffer layer 105 may be disposed on the light-blocking layer 102 and may be formed to cover the light-blocking layer 102. The buffer layer 105 may be composed of an inorganic insulating film, an organic insulating film, or a combination of an inorganic insulating film and an organic insulating film. The buffer layer 105 may be formed in a single-layer or multi-layer structure.

The driving thin-film transistor TFT may be disposed on the buffer layer 105. In an embodiment of the present disclosure, the driving thin-film transistor TFT may include an active area 110, a gate 125, a source electrode 140*a* and a drain electrode 140*b*. The active area 110 may be disposed on the buffer layer 105 so as to overlap the light-blocking layer 102. The gate 125 having a stacked structure of a gate insulating film 115 and a gate electrode 120 may be disposed on the active area 110. The source electrode 140*a* and the drain electrode 140*b* may be in direct contact with the active area 110. The source electrode 140*a* and the drain electrode 140*b* may be exchanged with each other in some embodiments.

The interlayer insulating film 130 may be disposed to cover all of the active area 110, the gate 125, the source electrode 140*a*, and the drain electrode 140*b*. The interlayer insulating film 130 may receive therein first contact holes 142 exposing a portion of a surface of the active area 110 so as to allow the source electrode 140*a* and the drain electrode 140*b* to come into contact with the active area 110.

The source electrode 140*a* and the drain electrode 140*b* may be spaced apart from each other while the gate 125 is interposed therebetween. The source electrode 140*a* and the drain electrode 140*b* may fill an entirety of each of the first contact holes 142 formed in the interlayer insulating film 130, and may extend so as to cover a portion of a top surface of the interlayer insulating film 130.

A plurality of data lines DL may be disposed on a top surface of the interlayer insulating film 130. The passivation film 150 may be disposed on the plurality of data lines DL. The passivation film 150 serves to protect the elements disposed thereunder and may be composed of an inorganic insulating film or an organic insulating film.

The planarization layer 155 having a second contact hole 160 defined therein may be disposed on the passivation film 150. The second contact hole 160 extending through the planarization layer 155 and the passivation film 150 exposes a portion of a surface of the drain electrode 140b. The planarization layer 155 may be composed of an inorganic insulating film or an organic insulating film.

The planarization layer 155 may be formed to have a sufficient thickness to planarize a surface while covering an entirety of the substrate 101. Accordingly, the second contact hole 160 extending through the planarization layer 155 and the passivation film 150 is formed to have a shape such that a width becomes narrower as the second contact hole 160 extends downwardly.

The first electrode 162 is disposed on the planarization layer 155. The first electrode 162 may be electrically connected to the gate 125 via the drain electrode 140b exposed through the second contact hole 160 extending through the passivation film 150 and the planarization layer 155. The first electrode 162 may be made of a transparent metal oxide such as indium-tin-oxide (ITO), or indium-zinc-oxide (IZO). The first electrode 162 may act as an anode electrode. The first electrodes may respectively correspond to pixel areas and be spaced apart from each other. For example, a first pixel area 162-a, a second pixel area 162-b, and a third pixel area 162-c may be arranged so as to be spaced apart from each other by a predetermined distance.

A plurality of banks 165 may be disposed on the planarization layer 155. The bank 165 may be a boundary area defining a light-emitting area of a pixel, and may serve to distinguish pixels from each other. The plurality of banks 165 may be arranged to be spaced apart from each other. Each of the plurality of banks 165 may space the first electrodes 162 from each other such that the first electrodes may respectively correspond to pixel areas. The bank 165 may be composed of an inorganic insulating film. In one example, the bank 165 may be composed of an inorganic insulating film including at least one of silicon oxide ($SiO_x$), silicon nitride ($SiN_x$), or silicon oxynitride ($SiON_x$).

As shown in FIG. 3B, pixel patterns 170, 180, and 190 may be respectively formed on exposed surfaces of the first electrodes 162 in the pixel areas 162-a, 162-b, and 162-c. Although not shown in the drawing, each of the pixel patterns 170, 180, and 190 may include a stacked structure of a hole transporting layer HTL, a light-emitting layer EML and an electron transporting layer ETL. Alternatively, each of the pixel patterns 170, 180, and 190 may be configured to include a hole transport layer HTL, a light-emitting layer EML, an electron transport layer ETL, a hole blocking layer HBL, a hole injecting layer HIL, an electron blocking layer EBL, and an electron injecting layer EIL.

In one example, the light-emitting layer EML of each of the pixel patterns 170, 180, and 190 emits light via recombination of holes injected from the first electrode 162 and electrons injected from the second electrode as a cathode electrode formed subsequently. In an embodiment of the present disclosure, the first pixel pattern 170 may emit red light. Further, the second pixel pattern 180 may emit green light, and the third pixel pattern 190 may emit blue light.

The first pixel pattern 170, the second pixel pattern 180, and the third pixel pattern 190 may be formed by repeatedly performing a process of depositing and patterning an organic material layer. In order to form each of the pixel patterns 170, 180, and 190, plasma treatment must be performed before the process of depositing the organic material film.

Specifically, in order to form the first pixel pattern 170, plasma treatment is first performed. Plasma treatment plays a role in removing foreign substances or residues generated during a previous process. In one example, the plasma treatment may include converting a mixed gas of nitrogen and oxygen $N_2/O_2$ into plasma.

After the plasma treatment, a first organic light-emitting layer (not shown) having a stacked structure of a hole transport layer HTL, a light-emitting layer EML and an electron transport layer ETL is formed on an entire surface of the substrate 100 including the first electrode 162 and the bank 165. Next, a first protective layer (not shown) and a photoresist film (not shown) are sequentially formed on the first organic light-emitting layer. Next, the photoresist film is patterned to form a photoresist film pattern defining the first pixel area 162-a where the first pixel pattern is to be formed.

Next, a first patterning process of etching the first protective layer and the first organic light-emitting layer using the photoresist film pattern as an etching mask is performed. Thus, as shown in FIG. 3A, the first pixel pattern 170 and a first protective pattern 175 overlapping the first pixel pattern 170 are selectively formed only on the first electrode 162 in the first pixel area 162-a. The first patterning process may be performed in a dry etching scheme. Then, the photoresist film pattern is removed. In this regard, the first pixel pattern 170 may be formed so as to cover an exposed surface of the first electrode 162 in the first pixel area 162-a while covering a portion of each of both opposing sidewalls of the bank 165 and a portion of a top surface of the bank 165.

The first protective pattern 175 overlapping the first pixel pattern 170 serves to prevent damage to the organic material film constituting the first pixel pattern 170 during the process. In one example, the first protective pattern 175 may be made of a polymeric material containing a large amount of fluorine (F) based on a carbon-carbon double bond.

In one example, since the second contact hole 160 has a large aspect ratio and a width which is gradually narrower as the second contact hole 160 extends downwardly, a first pixel pattern residual film 170a and the first protective pattern 175 are not removed from a bottom of the second contact hole 160 but remain thereon.

Further, each of the second pixel pattern 180 and the third pixel pattern 190 may be formed by performing the same patterning process as that of forming the first pixel pattern 170.

Specifically, referring to FIG. 3B, each of the second pixel pattern 180 and the third pixel pattern 190 may be formed by repeating a plurality of patterning processes. In one example, in order to form each of the pixel patterns 180 and 190, plasma treatment should be preceded before the organic light-emitting layer is deposited on the exposed surface of the first electrode 162.

After the plasma treatment has been performed, a second organic light-emitting layer and a second protective layer are formed on the substrate 101 such that the second organic light-emitting layer includes a stacked structure of a hole transport layer (HTL), a light-emitting layer (EML), and an electron transport layer (ETL). Then, a photoresist film is applied and patterned on the second protective layer to form a photoresist film pattern (not shown) defining the second pixel area 162-*b* (see FIG. 3A) where the second pixel pattern is to be formed.

Next, a second patterning process using the photoresist film pattern is performed to selectively form the second pixel pattern 180 and the second protective pattern 185 overlapping the second pixel pattern 180 only on the first electrode 162 in the second pixel area 162-*b*. The second pixel pattern 180 may be formed to cover a portion of each of both opposing sidewalls of the bank 165 and a portion of a top surface of the bank while covering the exposed surface of the first electrode 162. The second protective pattern 185 may be disposed to overlap the second pixel pattern 180. The second protective pattern 185 may be made of the same material as that of the first protective pattern 175.

In the above-described second patterning process, the second pixel pattern 180 should selectively remain only on the first electrode 162 in the second pixel area 162-*b*. However, as the second contact hole 160 has the large aspect ratio and has a width that is gradually narrower as the hole extends downwardly, a second pixel pattern residual film 180*a* may remain on the first protective pattern 175 remaining on the bottom of the second contact hole 160.

After the second pixel pattern 180 has been formed, the same patterning process as the process of forming each of the first pixel pattern 170 and the second pixel pattern 180 is performed to selectively form the third pixel pattern 190 and the third protective pattern 195 overlapping the third pixel pattern 190 on the first electrode 162 in the third pixel area 162-*c*. The third pixel pattern 190 may be formed to cover a portion of each of both opposing sidewalls of the bank 165 and a portion of the top surface of the bank while covering the exposed surface of the first electrode 162. The third protective pattern 195 may be disposed to overlap the third pixel pattern 190.

In the process of forming the third pixel pattern 190 as above-described, a third pixel pattern residual film 190*a* and the third protective pattern 195 may not be removed but remain on the second pixel pattern residual film 180*a*.

In one example, as described above, in order to form each of the pixel patterns 170, 180, and 190, plasma treatment must be preceded before depositing the organic material film. If the plasma treatment is not performed, the pixel patterns may be damaged due to the foreign substances or residues. This may act as a defect in an entire display device.

However, when the plasma treatment is performed while a surface of the first protective pattern 175 overlapping with the first pixel pattern 170, and a surface of the first protective pattern 175 remaining on the bottom of the second contact hole 160 are exposed, the exposed surface of the first protective pattern 175 reacts with plasma gas such that outgassing in which gas inside the first protective pattern 175 is discharged out thereof may occur. This outgassing causes damage to adjacent pixel patterns.

Further, since the plasma treatment is performed before depositing the organic material film, the plasma treatment is required at least 3 times to form red, blue and green pixel patterns. Then, as the outgassing repeatedly occurs during the repeated plasma treatments, damages to the pixel patterns may be accumulated. The accumulated damages to the pixel patterns may lead to luminance degradation, which in turn, eventually acts as a cause to decrease the lifespan of the organic light-emitting display device.

Further, as the second contact hole 160 has the large aspect ratio and has the width that is gradually narrower as the second contact hole 160 extends downwardly, the first pixel pattern residual film 170*a*, the second pixel pattern residual film 180*a*, and the third pixel pattern residual film 190*a* may remain on the bottom of the second contact hole 160. This may act as a cause of another defect.

Accordingly, in another embodiment of the present disclosure, a structure of an organic light-emitting display device and a manufacturing method thereof capable of preventing outgassing induced in the plasma treatment process will be described below with reference to the drawings.

Figure 4:
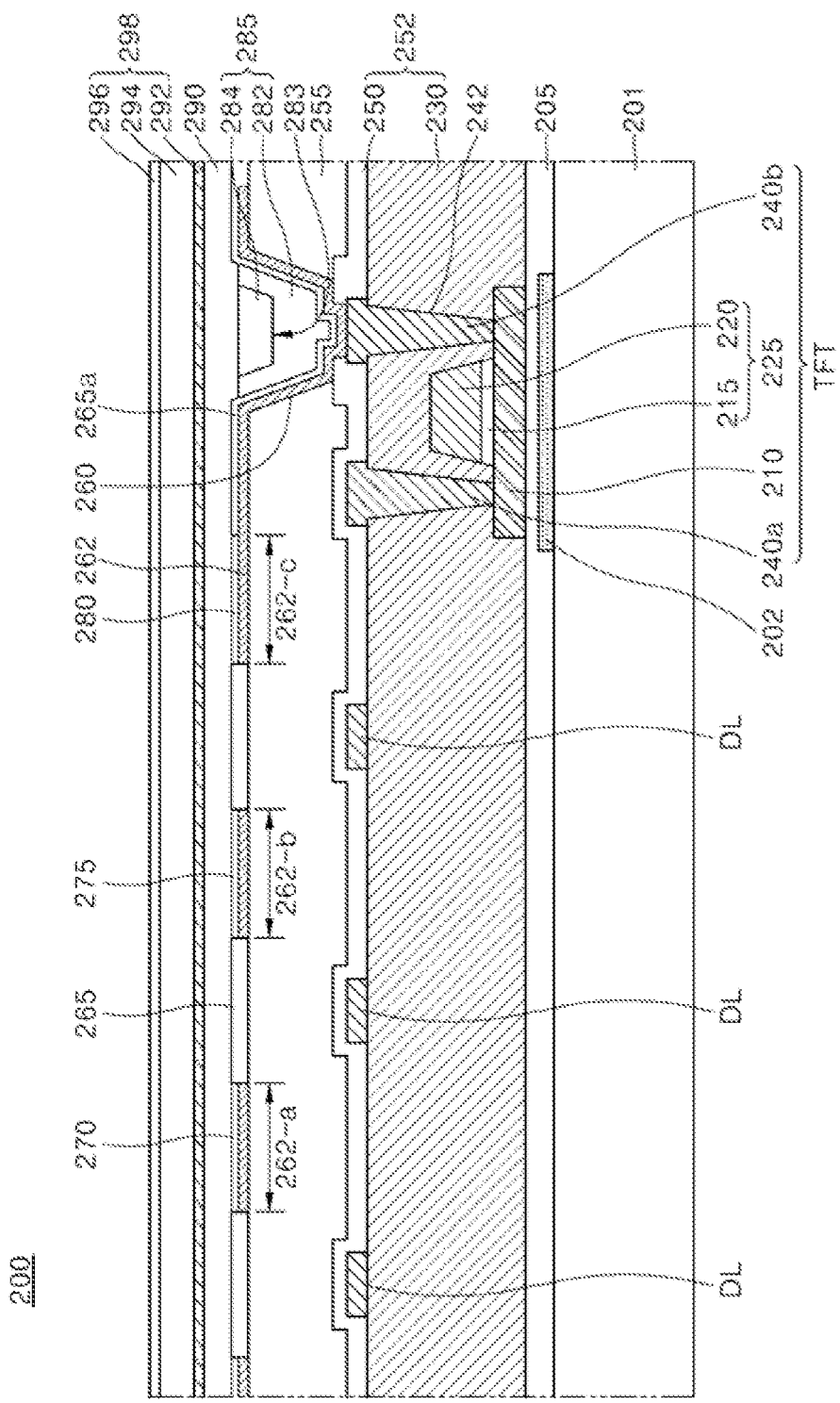
FIG. 4 is a cross-sectional view showing FIG. 2 as cut along I-I' to illustrate an organic light-emitting display device according to another embodiment of the present disclosure.

FIG. 4 is a cross-sectional view showing FIG. 2 as cut along I-I' to illustrate an organic light-emitting display device according to another embodiment of the present disclosure. In this regard, the same or similar components as or to those of FIG. 3A and FIG. 3B will be briefly described.

Referring to FIG. 4, an organic light-emitting display device 200 according to another embodiment of the present disclosure may have, on a substrate 201, the driving thin-film transistor TFT and an insulating film 252 covering an entire surface of the substrate 201 except for a portion of the driving thin-film transistor TFT. A light-blocking layer 202 may be disposed on the substrate 201 so as to overlap the driving thin-film transistor TFT, and the light-blocking layer 202 may be formed to be covered with the buffer layer 205.

The driving thin-film transistor TFT may be disposed on the buffer layer 205.

In another embodiment of the present disclosure, the driving thin-film transistor TFT may include an active area 210, a gate 225, a source electrode 240*a*, and a drain electrode 240*b*. The gate 225 in which a gate insulating film 215 and a gate electrode 220 are stacked may be disposed on the active area 210. The source electrode 240*a* and the drain electrode 240*b* may be disposed in direct contact with the active area 210, and may be arranged to be spaced apart from each other while the gate 225 is interposed therebetween.

The insulating film 252 disposed on the substrate 201 may be formed in a structure in which an interlayer insulating film 230 and a passivation film 250 are stacked. The interlayer insulating film 230 may be formed to cover the entire surface of the substrate 201 except for the portion of the driving thin-film transistor TFT, for example, the source electrode 240*a* and the drain electrode 240*b*. A plurality of data lines DL may be disposed on the interlayer insulating film 230. The source electrode 240*a* and the drain electrode 240*b* may be formed to be connected to the gate 225 via a first contact hole 242 extending through the interlayer insulating film 230. The passivation film 250 may be formed to cover the plurality of data lines DL.

A planarization layer 255 having a second contact hole 260 defined therein may be disposed on the insulating film 252. The second contact hole 260 exposes a portion of a surface of the drain electrode 240*b*. The planarization layer 255 may be formed to have a sufficient thickness so as to cover the entire surface of the substrate 201 and at the same time, to planarize the surface, and may be composed of an inorganic insulating film or an organic insulating film. Accordingly, the second contact hole 260 may be formed to have a shape such that a width becomes narrower as the second contact hole 260 extends from a top to a bottom.

The first electrode 262 is disposed on an exposed surface of the second contact hole 260 and the planarization layer 255. The first electrode 262 may be electrically connected to the driving thin-film transistor TFT via the drain electrode 240*b* exposed through the second contact hole 260. The first electrode 262 may act as an anode electrode that supplies holes to the organic light-emitting layer. The first electrodes may be arranged to be spaced apart from each other and may respectively correspond to pixels.

A plurality of banks 265 are disposed on the planarization layer 255 so as to expose a portion of the first electrode 262 to define a light-emitting area of the pixel. The bank 265 may act as a boundary area defining the light-emitting area of the pixel. Thus, an area in which the bank 265 is formed may be defined as a non-light-emitting area, while an area in which the bank 265 is not formed may be defined as the light-emitting area. The plurality of banks 265 may be arranged to be spaced apart from each other such that each bank serves to space adjacent first electrodes 262 corresponding to adjacent pixels from each other. The light-emitting area defined by the bank 265 may include a first pixel area 262-a, a second pixel area 262-b and a third pixel area 262-c. The first electrode 262 may be disposed in each of the pixel areas 262-a, 262-b, and 262-c.

The bank 265 is composed of an inorganic insulating film including at least one of silicon oxide ($SiO_x$), silicon nitride ($SiN_x$), or silicon oxynitride ($SiON_x$). As the bank 265 is composed of the inorganic insulating film, the bank may be formed to have a relatively smaller thickness than that when the bank is composed of an organic film made of, for example, acryl or epoxy. Accordingly, a total thickness of the display device may be reduced. Further, when the bank is composed of the organic film, outgassing may occur due to generation of gas compounds from the organic film during the process. However, in the organic light-emitting display device 200 according to the present disclosure, the bank 265 is composed of the inorganic insulating film, thereby further preventing the outgassing from occurring.

In one example, the bank 265 may include a bank thin-film 265a formed along a shape of a surface of the first electrode 262 formed on the exposed surface of the second contact hole 260.

A plurality of pixel patterns 270, 275, and 280 may be disposed on the first electrode 262 exposed through the bank 265. The plurality of pixel patterns 270, 275, and 280 may include a first pixel pattern 270 disposed in the first pixel area 262-a, a second pixel pattern 275 disposed in the second pixel area 262-b, and a third pixel pattern 280 disposed in the third pixel area 262-c. The first to third pixel patterns 270, 275, and 280 may emit light beams of different colors, for example, red, green, and blue, respectively. Although not shown, the plurality of pixel patterns may further include a fourth pixel pattern for emitting white light.

In one example, as the bank 265 is composed of the inorganic insulating film, each of the top surfaces of the pixel patterns 270, 275, and 280 may have the same vertical level as that of a top surface of the bank 265.

An inner space of the second contact hole 260 may be filled with a sealing portion 285. The sealing portion 285 may be configured to include a protective pattern 282 that covers both opposing sidewalls and a bottom of the second contact hole 260 and fills the inner space thereof and has a concave-shaped groove 283 defined in a top portion thereof, and an island pattern 284 that fills the concave-shaped groove 283.

The protective pattern 282 may be made of a polymer material containing a large amount of fluorine (F) based on a carbon-carbon double bond so as to have orthogonality. The orthogonality may be understood as a property in which two objects are not related to each other but exist independently of each other. In other words, the protective pattern 282 has both hydrophobic properties with low affinity to water and oleophobic properties with low affinity to oil. Under this orthogonality, the protective pattern 282 may be separated from moisture or reject the moisture. Accordingly, a path through which moisture permeates may be blocked by the protective pattern 282 formed to cover each of both opposing sidewalls and the bottom of the second contact hole 260.

Further, the island pattern 284 may be formed in a shape of a plug such that the pattern 284 fills the groove 283 of the concave shape defined in the protective pattern 282. The island pattern 284 may include a photoresist material. The island pattern 284 may be formed in a shape in which an outer side surface is surrounded with the protective pattern 282 in a plan view.

As an entirety of the inner space of the second contact hole 260 is filled with the sealing portion 285 formed to cover each of the opposing sidewall and the bottom of the second contact hole 260, the moisture permeation path may be blocked with the sealing portion 285. Further, the bank thin-film 265a composed of the inorganic insulating film disposed on the first electrode 262 formed on the exposed surface of the second contact hole 260 may be disposed to cover an entirety of an outer side surface of the protective pattern 282. Accordingly, outgassing in which the gas compound is discharged out of the second contact hole 260 may be prevented. The sealing portion 285 may have a top surface positioned at a lower level than that of a top surface of the bank 265.

A second electrode 290 may be disposed over an entire surface of the substrate 201 and may be disposed on the sealing portion 285. The second electrode 290 may be formed to cover an entirety of an exposed surface of the sealing portion 285 while being connected to the plurality of pixel patterns. The second electrode 290 may act as a common electrode which commonly contacts the first pixel pattern 270, the second pixel pattern 275, and the third pixel pattern 280 and applies a common voltage thereto. The second electrode 290 may act as a cathode electrode, and thus may supply electrons to the pixel patterns 270, 275, and 280.

In one example, the second electrode 290 may be made of a transparent metal oxide such as indium-tin-oxide (ITO) or indium-zinc-oxide (IZO). Alternatively, the second electrode 290 may be made of a semi-transmissive metal material including at least one of molybdenum (Mo), tungsten (W), silver (Ag), or aluminum (Al) and an alloy thereof.

An encapsulation layer 298 may be disposed on the second electrode 290. The encapsulation layer 298 may include a first encapsulation film 292, a cover film 294, and a second encapsulation film 296. The encapsulation layer 298 serves to prevent moisture, oxygen, or particles from invading into the organic light-emitting display device 200. The first encapsulation film 292 and the second encapsulation film 296 may include an inorganic insulating film of the same type. However, the disclosure is not limited thereto. For example, each of the first and second encapsulation films 292 and 296 may include an inorganic insulating film made of, for example, silicon oxide ($SiO_x$), silicon nitride ($SiN_x$), aluminum oxide ($AlO_x$), or aluminum nitride ($AlN_x$) The cover film 294 may be made of a transparent organic material, for example, epoxy resin, polyimide resin, or acryl resin. However, the disclosure is not limited thereto.

Hereinafter, a method for manufacturing an organic light-emitting display device according to another embodiment of the present disclosure will be described with reference to the drawings.

FIGS. 5 to 24 are diagrams for illustrating a method for manufacturing an organic light-emitting display device according to another embodiment of the present disclosure. In this regard, FIG. 5 to FIG. 24 are cross-sectional views of FIG. 2 taken along I-I'.

Figure 5:
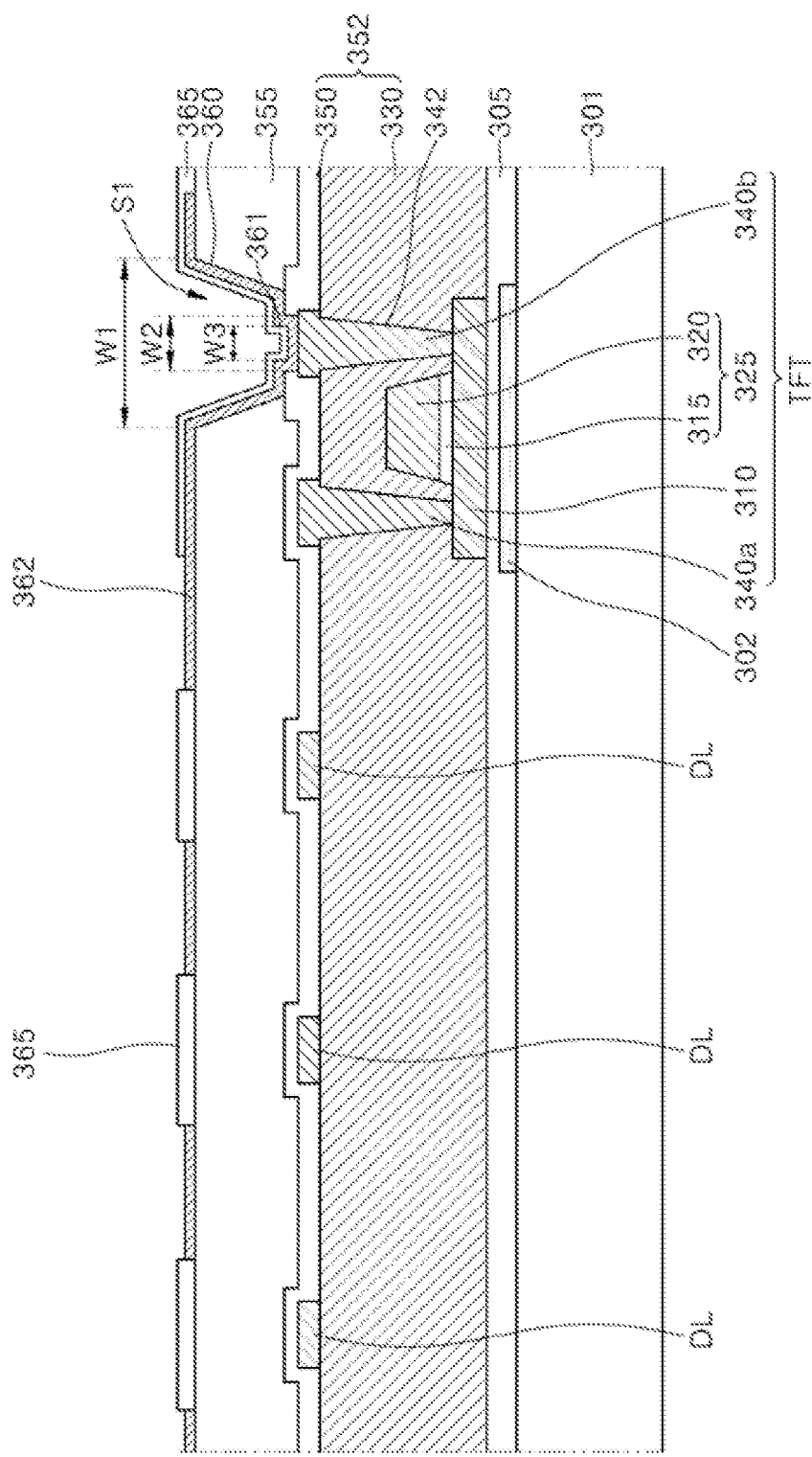
FIGS. 5 to 24 are diagrams for illustrating a method for manufacturing an organic light-emitting display device according to another embodiment of the present disclosure.

Referring to FIG. 5, a light-blocking layer 302 is formed on the substrate 301, and a buffer layer 305 covering an entire surface of the substrate 301 is formed on the light-blocking layer 302. The substrate 301 may be embodied as a light-transmitting substrate. The substrate 301 may be made of a rigid material such as glass or tempered glass, or a flexible material made of plastic. However, the disclosure is not limited thereto.

The light-blocking layer 302 is disposed to overlap the active area so as to block external light input to the driving transistor to prevent off-current from occurring in the driving transistor.

The buffer layer 305 may prevent diffusion of ions or impurities from the substrate 301 toward an organic light-emitting element disposed above the substrate. The buffer layer 305 may be composed of an inorganic insulating film including silicon oxide ($SiO_x$), silicon nitride ($SiN_x$) or silicon oxynitride (SiON), an organic insulating film, or a combination of an inorganic insulating film and an organic insulating film. The buffer layer 305 may be formed as a single layer or a multilayer structure including an inorganic insulating film and an organic insulating film.

The driving thin-film transistor TFT may be disposed on the buffer layer 305. In an embodiment of the present disclosure, the driving thin-film transistor TFT may be configured to include an active area 310, a gate 325, a source electrode 340a, and a drain electrode 340b.

The active area 310 includes a source area and a drain area containing p-type or n-type impurity ions, and a channel disposed between the source area and the drain area. The active area 310 may include at least one of amorphous silicon, polycrystalline silicon, and an oxide semiconductor.

The gate 325 having a stacked structure of a gate insulating film 315 and a gate electrode 320 may be disposed on the active area 310. The gate insulating film 315 may be composed of a single layer made of an insulating material including silicon oxide ($SiO_x$) or silicon nitride ($SiN_x$). However, the disclosure is not limited thereto. For example, the gate insulating film 315 may have a multilayer structure of a film made of silicon oxide ($SiO_x$) and a film made of silicon nitride ($SiN_x$). The gate electrode 320 may be made of one selected from metals including chromium (Cr), molybdenum (Mo), aluminum (Al), gold (Au), titanium (Ti), nickel (Ni), copper (Cu), and the like, or an alloy thereof.

The interlayer insulating film 330 may be formed on the driving thin-film transistor TFT. The interlayer insulating film 330 may be formed over an entire surface of the substrate 101 and on the gate 325 and the active area 310, and may be formed to have a thickness such that the interlayer insulating film 330 covers an entire top surface of the gate 325. The interlayer insulating film 330 may be composed of a single layer as an inorganic insulating film including silicon oxide ($SiO_x$) or silicon nitride ($SiN_x$), or may be composed of a stack of a plurality of layers, that is, a stack of an inorganic insulating film and an organic insulating film.

Each of first contact holes 342 extending through the interlayer insulating film 330 and exposing a portion of a surface of the active area 310 may be defined in the interlayer insulating film 330. The first contact holes 342 may be filled with the source electrode 340a and the drain electrode 340b, respectively. The source electrode 340a and the drain electrode 340b may be arranged to be spaced apart from each other while the gate 325 is interposed therebetween. The source electrode 340a and the drain electrode 340b may be electrically connected to the source area and the drain area via exposed surfaces of the active area 310, respectively. Each of the source electrode 340a and the drain electrode 340b may be formed by filling an entirety of an inner space of each of the first contact holes 342. Then, each of the source electrode 340a and the drain electrode 340b may extend horizontally so as to cover a portion of a top surface of the interlayer insulating film 330.

Each of the source electrode 340a and the drain electrode 340b may be made of one selected from metals including chromium (Cr), molybdenum (Mo), aluminum (Al), gold (Au), titanium (Ti), nickel (Ni), copper (Cu), and the like, or an alloy thereof.

A plurality of data lines DL may be disposed on the interlayer insulating film 330. A passivation film 350 covering the data lines DL may be formed on the interlayer insulating film 330. The passivation film 350 refers to an insulating film for protecting the elements disposed thereunder, and may be embodied as a single layer composed of an inorganic insulating film including silicon oxide ($SiO_x$) or silicon nitride ($SiN_x$), or as a stack of a plurality of layers, for example, a stack of an inorganic insulating film and an organic insulating film. However, the disclosure is not limited thereto.

A planarization layer 355 having a second contact hole 360 defined therein may be disposed on the passivation film 350. The planarization layer 355 may be embodied as a single layer composed of an inorganic insulating film, or a stack of a plurality of layers, for example, a stack of an inorganic insulating film and an organic insulating film. However, the disclosure is not limited thereto. The second contact hole 360 extending through the planarization layer 355 and the passivation film 350 may be formed to expose a portion of a surface of the drain electrode 340b.

The planarization layer 355 may be formed to have a thickness sufficient to planarize the surface while extending over an entirety of the substrate 301. The second contact hole 360 formed in the planarization layer 355 may be formed to have an inner space S1 having a large aspect ratio and a width which gradually decreases as the hole extends downwardly. For example, the second contact hole 360 may be formed in a shape in which a width w2 of a bottom thereof is relatively smaller than a width w1 of a top thereof. In one example, the second contact hole 360 may further have a depression 361 in which a portion of the bottom of the contact hole is depressed. A width w3 of the depression 361 may be relatively smaller than the width w2 of the bottom of the second contact hole 360.

A first electrode 362 is formed on a planarization layer 355. The first electrode 362 may be electrically connected to the gate 325 via the drain electrode 340b exposed through the second contact hole 360 extending through the passivation film 350 and the planarization layer 355. The first electrode 362 may be made of a transparent metal oxide such as indium-tin-oxide (ITO) or indium-zinc-oxide (IZO). The first electrode 362 may act as an anode electrode, and may be divided into a plurality of portions arranged to be spaced apart from each other and corresponding to the pixels.

A bank 365 is formed on the planarization layer 355. The bank 365 may be a boundary area defining a light-emitting area of a pixel, and may serve to distinguish pixels from each other. The bank 365 acts as a barrier to prevent light beams of different colors from adjacent different pixels from being mixed with each other. The bank 365 may be divided into a plurality of portions arranged to be spaced apart from each other. Each of the plurality of portions of the bank 365 may space the portions of the first electrode 362 from each other such that the portions of the first electrode may respectively correspond to pixel areas. The bank 365 may be further formed along and on a portion of the first electrode 362 formed along and on the sidewall and the bottom of the second contact hole 360.

The bank 365 in accordance with another embodiment of the present disclosure may be composed of an inorganic insulating film. For example, the bank 365 may include silicon oxide or silicon nitride. As the bank 365 is composed of the inorganic insulating film, the bank may be formed to have a relatively smaller thickness than that when the bank is composed of an organic film made of, for example, acryl or epoxy. Accordingly, a total thickness of the display device may be reduced. Further, when the bank is composed of the organic film, outgassing may occur due to generation of gas compounds from the organic film during the patterning process. However, in the organic light-emitting display device according to the present disclosure, the bank 365 is composed of the inorganic insulating film, thereby preventing the outgassing from the bank from occurring.

Figure 6:
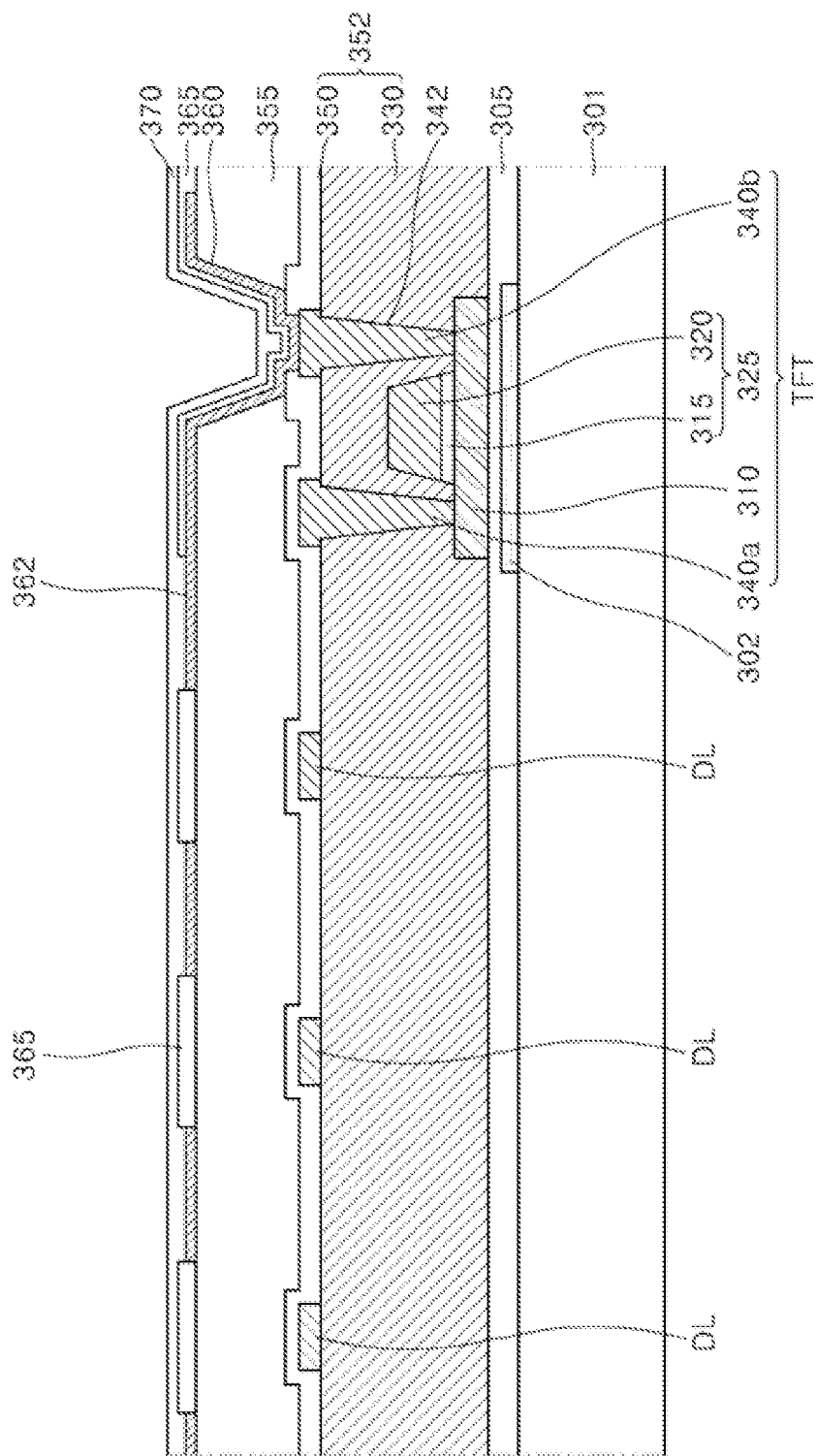

Referring to FIG. 6, a first protective layer 370 is formed over an entirety of the substrate 301 and along and on the second contact hole 360. The first protective layer 370 serves to prevent the organic light-emitting layer to be subsequently formed from being damaged during the process, for example, from being damaged due to an etchant. In this regard, as the second contact hole 360 is formed to have a shape such that the second contact hole 360 becomes narrower as the hole extends downwardly, the first protective layer 370 may be formed, by a predetermined thickness, on and along a portion of the bank 365 extending along and on both opposing sidewalls and the bottom of the second contact hole 360.

In one example, the first protective layer 370 may be made of a polymer material containing a large amount of fluorine (F) based on a carbon-carbon double bond so as to have orthogonality.

As the first protective layer 370 contains a large amount of fluorine (F), the layer 370 has orthogonality. The orthogonality may be understood as a property in which two objects are not related to each other but exist independently of each other. In other words, the first protective layer 370 has both hydrophobic properties with low affinity to water and oleophobic properties with low affinity to oil. Under this orthogonality, the first protective layer 370 may be separated from moisture or reject the moisture. Accordingly, a path through which moisture permeates may be blocked by the first protective layer 370. Further, the first protective layer 370 is less affected by a developer containing an organic solvent used in a process step.

Figure 7:
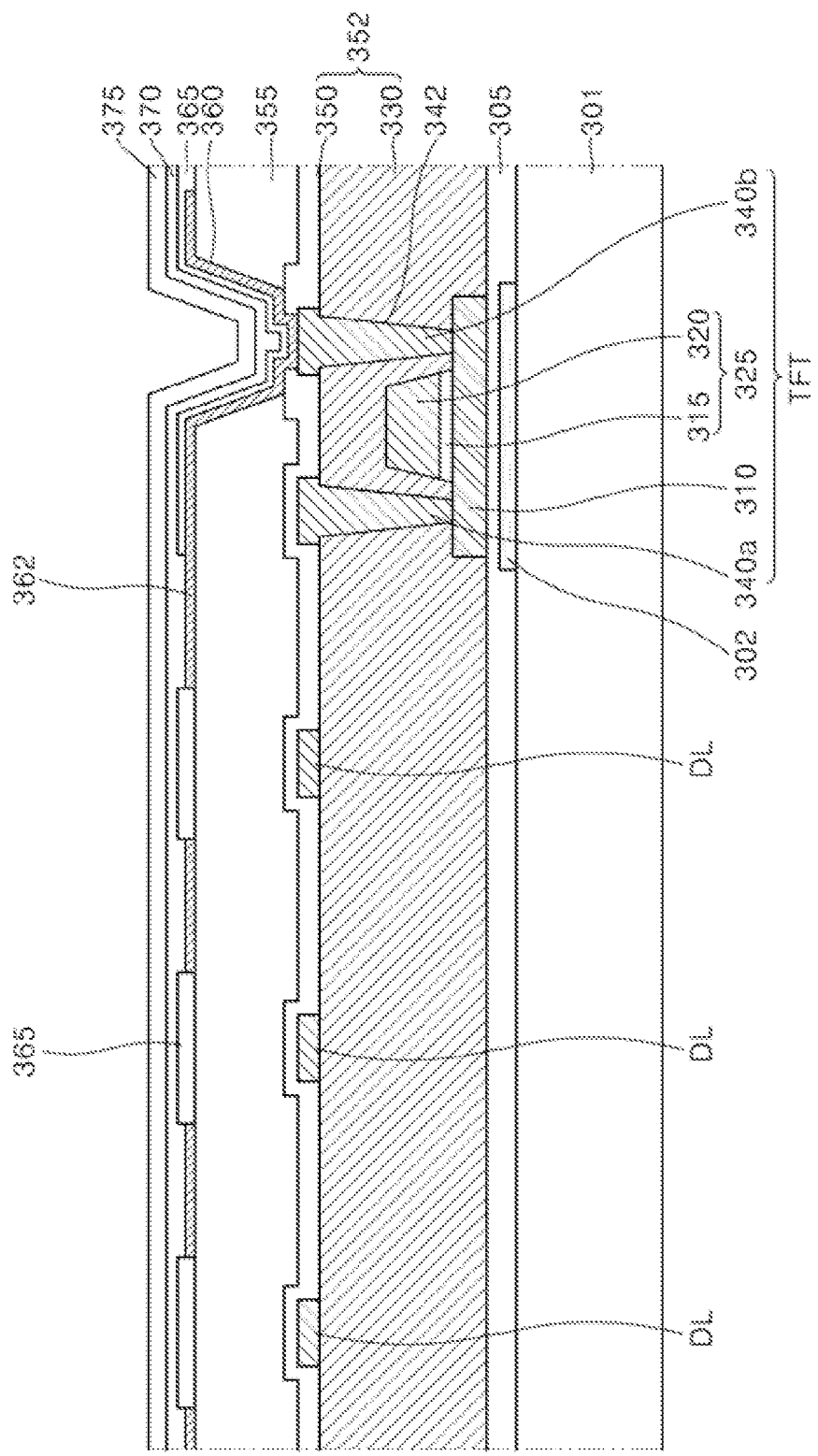

Referring to FIG. 7, a preliminary photoresist layer 375 is applied on the first protective layer 370. The preliminary photoresist layer 375 may be formed over an entirety of the substrate 301 and may be conformal to the first protective layer 370. The preliminary photoresist layer 375 serves as a base for forming a first photoresist layer to be subsequently formed. The preliminary photoresist layer 375 may be made of one of a positive type photoresist material or a negative type photoresist material. The preliminary photoresist layer 375 may be made of a positive type photoresist material in an embodiment of the present disclosure.

Figure 8:
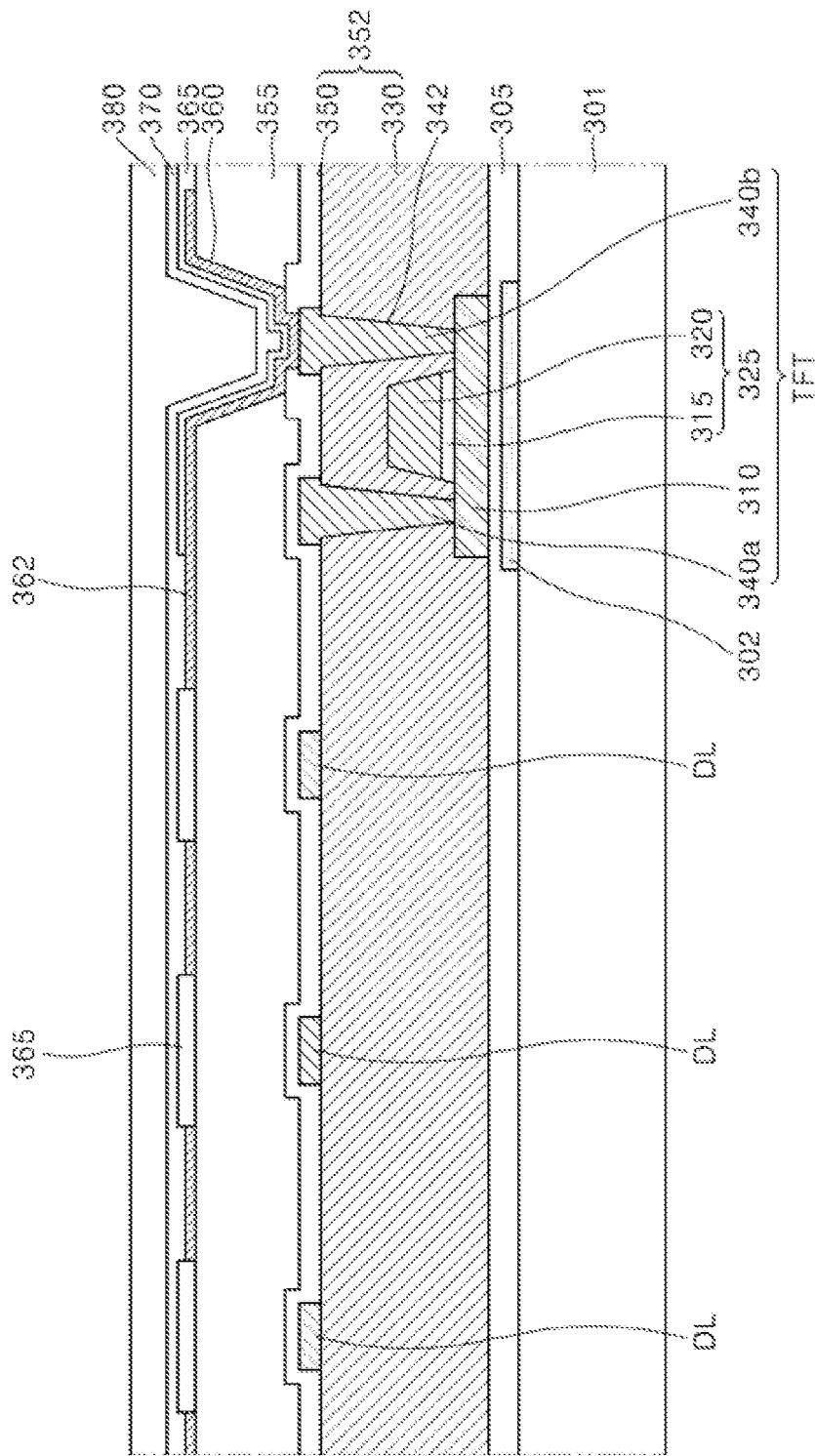

Referring to FIGS. 7 and 8, a first photoresist layer 380 is formed by additionally applying a photoresist material on the preliminary photoresist layer 375. The first photoresist layer 380 may have a sufficient thickness such that the first photoresist layer 380 fills an entirety of a remaining portion of the inner space S1 of the second contact hole 360 and covers, by a predetermined thickness, a surface of the first protective layer 370.

Figure 9:
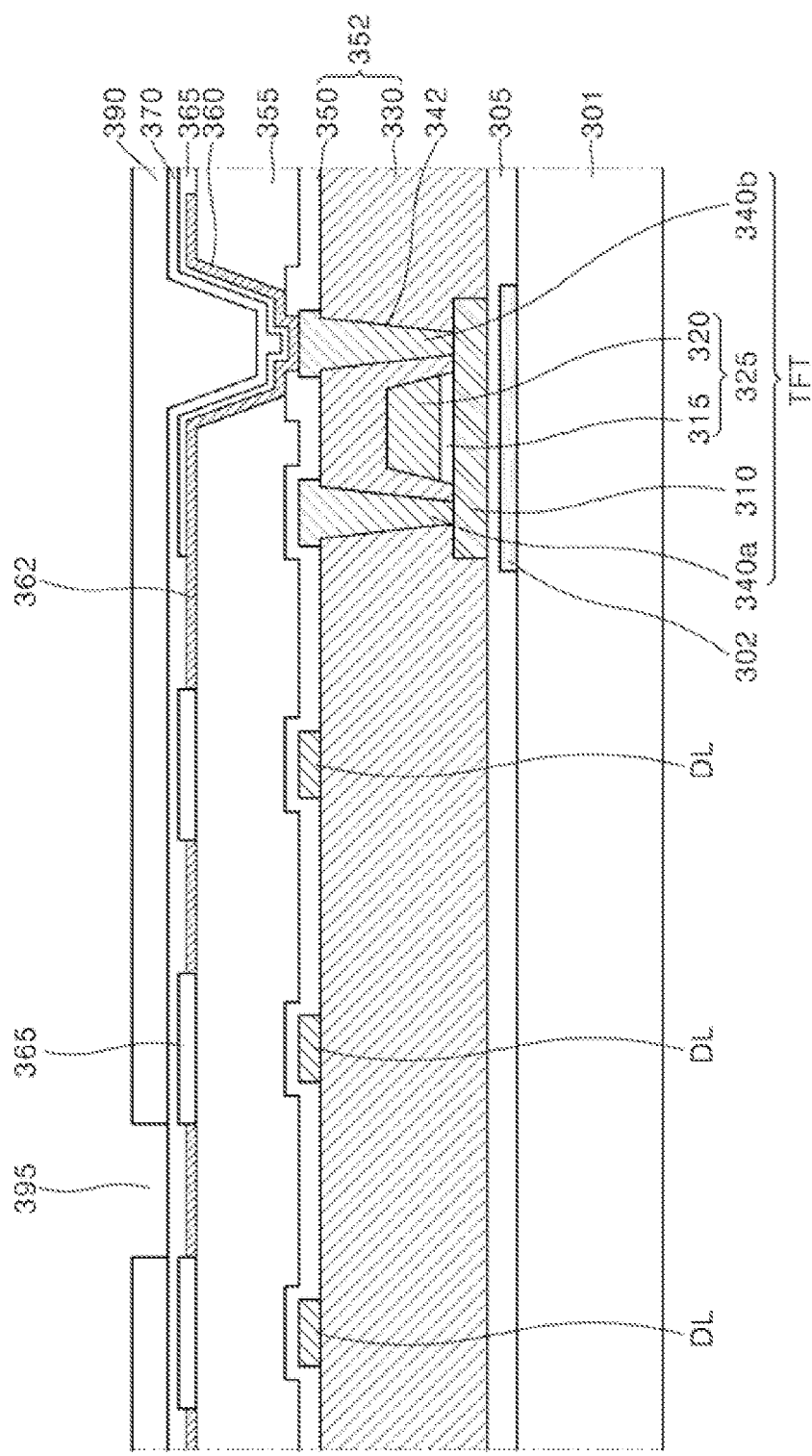

Referring to FIG. 9, a first photoresist pattern 390 having an opening area 395 defined therein defining an area where the first pixel pattern of the organic light-emitting layer is to be formed is formed. To this end, a mask pattern (not shown) covers a remaining area except for the area where the first pixel pattern of the organic light-emitting layer is to be formed, and then an exposure process and a developing process are performed thereon. Thus, only an exposed portion of the photoresist material is then selectively removed to form the first photoresist pattern 390 having the opening area 395 defined therein that defines the area in which the first pixel pattern of the organic light-emitting layer is to be formed. A portion of a surface of the first protective layer 370 may be exposed through the opening area 395 of the first photoresist pattern 390.

Figure 10:
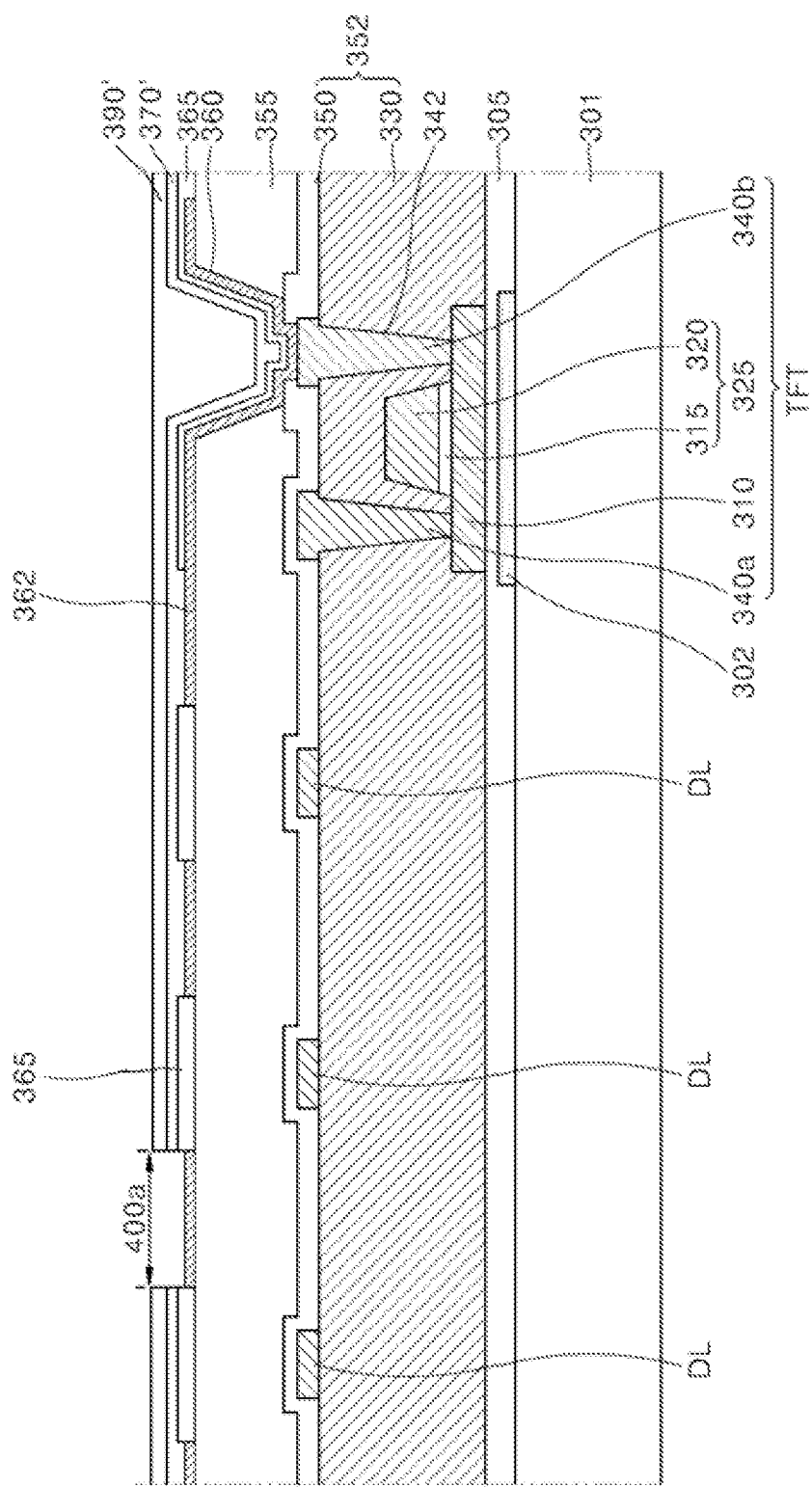

Referring to FIG. 10, the portion of the first protective layer 370 exposed through the opening area 395 of the first photoresist pattern 390 is removed. The exposed portion of the first protective layer 370 may be removed by performing a dry etching process. In an embodiment of the present disclosure, in the dry etching process, a reactive gas containing sulfur hexafluoride ($SF_6$) or carbon tetrafluoride ($CF_4$) may be used as an etching gas. However, the disclosure is not limited thereto.

The first photoresist pattern 390 has a relatively higher etch rate than that of the first protective layer 370. Accordingly, after the dry etching process for removing the exposed portion of the first protective layer 370 is performed, a resulting first photoresist pattern 390' may have a thickness of 10% to 20% of an initial thickness of the first photoresist pattern 390. Further, even though the etch rate of the photoresist material is relatively higher than that of the first protective layer 370, a portion of the first photoresist pattern 390' filling the inner space S1 of the second contact hole 360 may remain in the inner space S1 of the second contact hole 360 after the dry etching process.

Under this dry etching process, a first protective layer 370' having a first opening 400a defined therein exposing a surface of the first electrode 362 in the area where the first pixel pattern is to be formed may be formed. In one example, when the bank is composed of an organic film, damage to the bank may occur due to a dry etching source during the dry etching process as described above. When the bank is damaged, the outgassing phenomenon may be accelerated in a subsequent plasma treatment process. However, in an embodiment of the present disclosure, the bank 365 is composed of the inorganic insulating film, thereby preventing the damage to the bank.

After the dry etching process is performed, plasma treatment is performed to remove foreign substances or residues generated during the process. In one example, plasma treatment may remove foreign substances present on the first electrode 362. Plasma treatment may be performed using plasma into which a mixture of nitrogen and oxygen ($N_2/O_2$) is converted.

In one example, when plasma treatment is performed while a surface of the first protective layer 370' is exposed, outgassing in which the exposed surface of the first protective layer 370' reacts with the plasma gas to generate the gas compound which in turn is discharged to an outside may occur. Such outgassing may damage adjacent pixel patterns to cause a problem of degrading performance of the organic light-emitting display device such as luminance degradation over time.

However, in an embodiment of the present disclosure, as the first photoresist pattern 390' covers an entirety of the exposed surface of the first protective layer 370' and fills an entirety of the inner space S1 of the second contact hole 360, the outgassing from the first protective pattern 370' may be prevented in the plasma treatment process.

Figure 11:
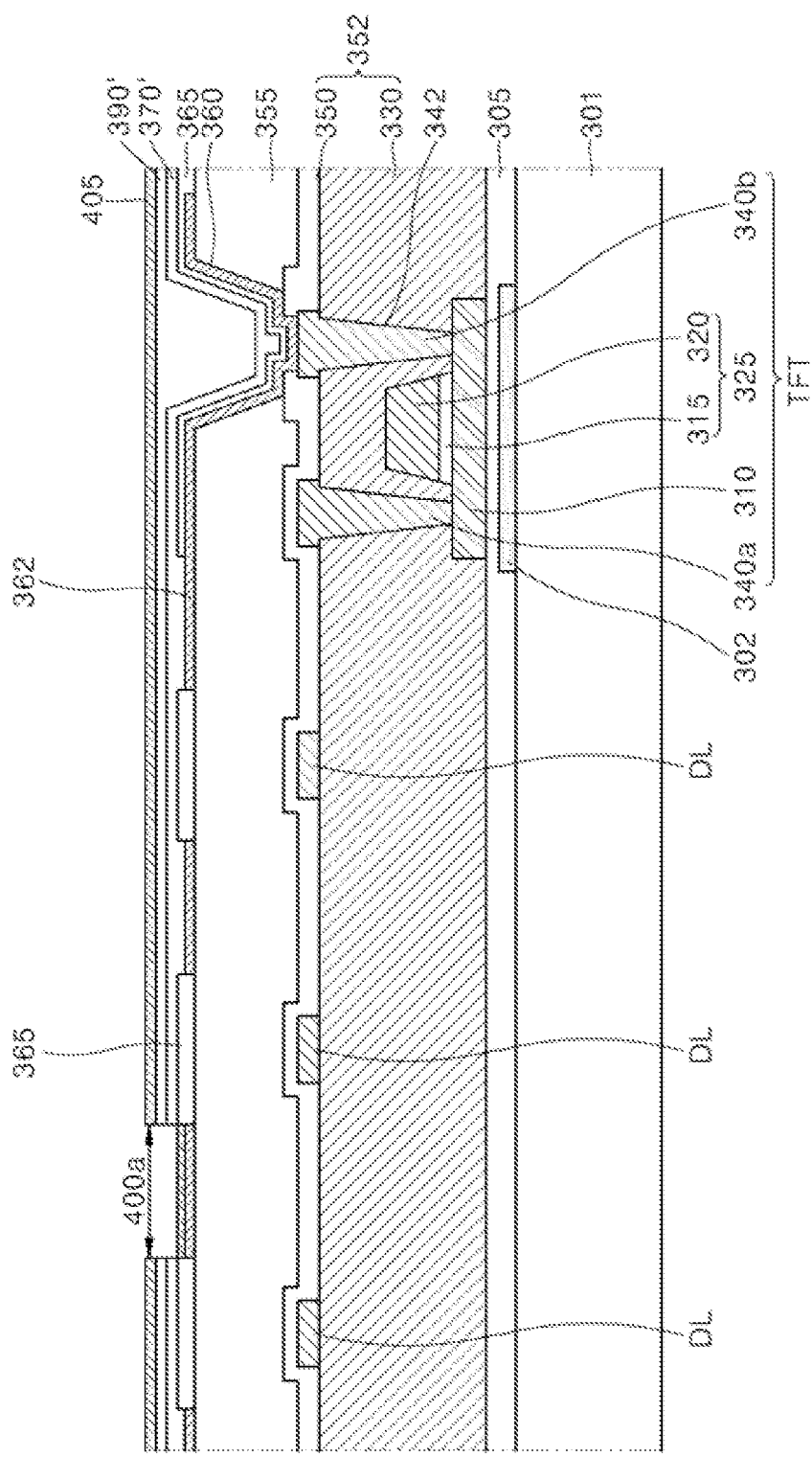

Referring to FIG. 11, a first organic light-emitting layer 405 is formed over an entirety of the substrate 301 and on the first photoresist pattern 390'. The first organic light-emitting layer 405 may be formed along and on an exposed portion of the first electrode 362 and a surface of the first photoresist pattern 390'.

Although not shown in the drawing, the first organic light-emitting layer 405 may include a stacked structure of a hole transport layer HTL, a light-emitting layer EML, and an electron transport layer ETL. Alternatively, the first organic light-emitting layer 405 may include a hole transport layer HTL, a light-emitting layer EML, an electron transport layer ETL, a hole blocking layer HBL, a hole injection layer HIL, an electron blocking layer EBL, and an electron injecting layer EIL.

Specifically, the hole transport layer HTL and the electron transport layer ETL of the first organic light-emitting layer 405 play a role in balancing amounts of the electrons and the holes with each other. In this regard, the hole transport layer HTL serves to transport the holes supplied from the first electrode 362 to the light-emitting layer, while the electron transport layer ETL serves to transport the electrons supplied from the second electrode to be subsequently formed to the light-emitting layer without loss thereof.

Further, the hole injection layer HIL and the electron injection layer EIL of the first organic light-emitting layer 405 serve to facilitate the injection of electrons and holes, respectively. In this regard, the hole injection layer HIL may facilitate hole injection by lowering an injection energy barrier of the holes supplied from the first electrode 362. The electron injection layer EIL may facilitate electron injection by lowering a potential barrier during injection of electrons supplied from the second electrode to be formed later. The hole blocking layer HBL plays a role in inhibiting movement of holes that are not combined with electrons in the light-emitting layer EML, while the electron blocking layer EBL plays a role in preventing electrons from moving from the light-emitting layer EML to the hole transport layer HTL.

In this regard, after the above-described plasma treatment is performed to remove foreign substances remaining on the first electrode 362, the first organic light-emitting layer 405 is formed. Thus, the movement of electrons to the hole injection layer HIL will be facilitated.

The light-emitting layer EML of the first organic light-emitting layer 405 emits light via recombination of holes injected from the first electrode 362 and electrons injected from the second electrode to be formed later. In an example of the present disclosure, the light-emitting layer EML may emit red light.

Figure 12:
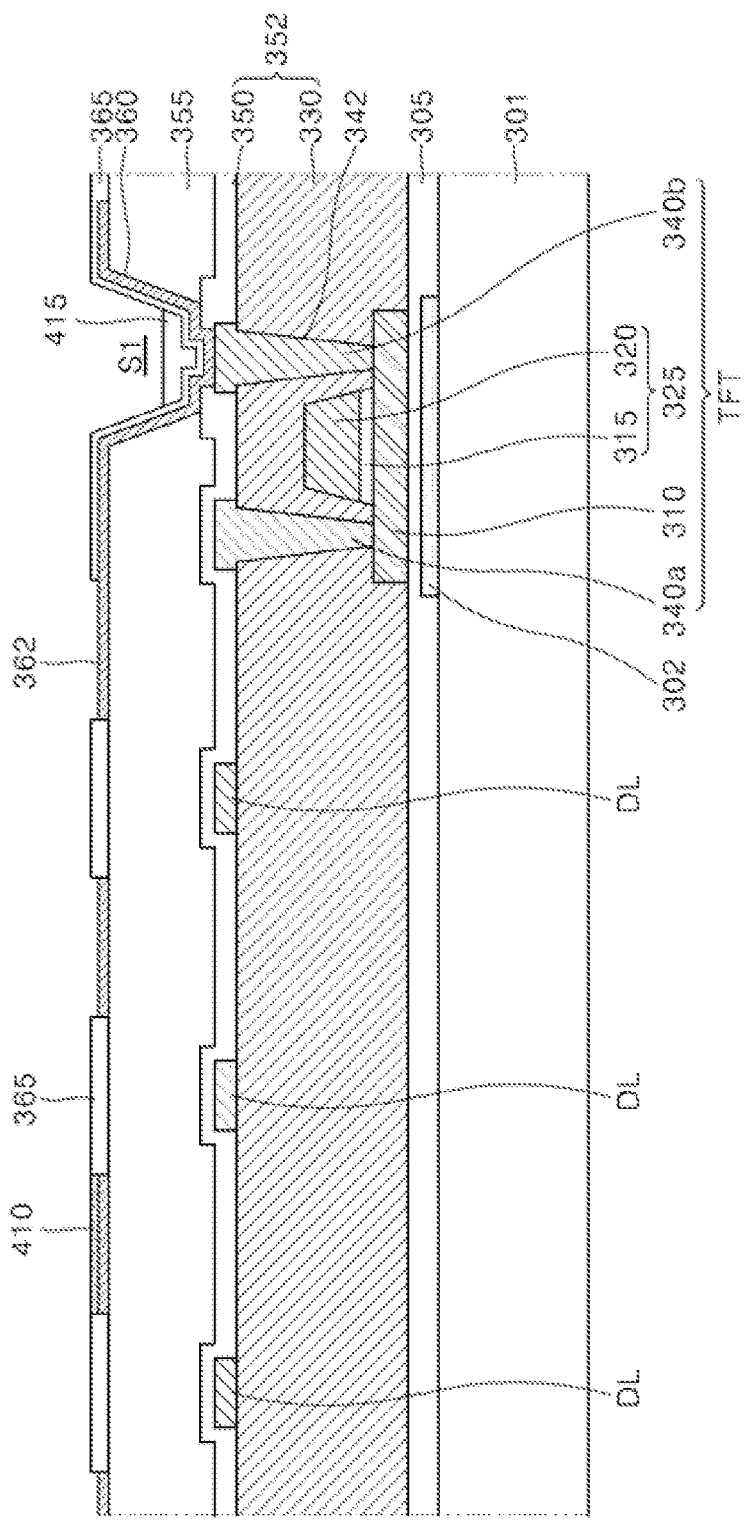

Referring to FIG. 12, the first pixel pattern 410 is formed by performing a lift-off process. The lift-off process may be performed using a fluorine (F)-based organic solvent. The fluorine (F)-based organic solvent may invade into the first protective layer 370' made of a polymer material containing a large amount of fluorine (F) and thus may selectively remove the first protective layer 370'. Then, the first photoresist pattern 390' and the first organic light-emitting layer 405 disposed on the first protective layer 370' may be removed together while the first protective layer 370' is removed.

In this regard, an organic material constituting the first pixel pattern 410 is resistant to the fluorine (F)-based organic solvent, and thus may not deteriorate or change. Accordingly, the first pixel pattern 410 may not be damaged during the lift-off process.

In one example, during the lift-off process, the fluorine (F)-based organic solvent does not invade into the first protective layer 370' disposed on the bottom of the second contact hole 360. Thus, the first protective layer 370' disposed on the bottom of the second contact hole 360 is not removed and thus may be converted into a first protective pattern 415 filling a lower portion of the inner space S1 of the second contact hole 360.

Figure 13:
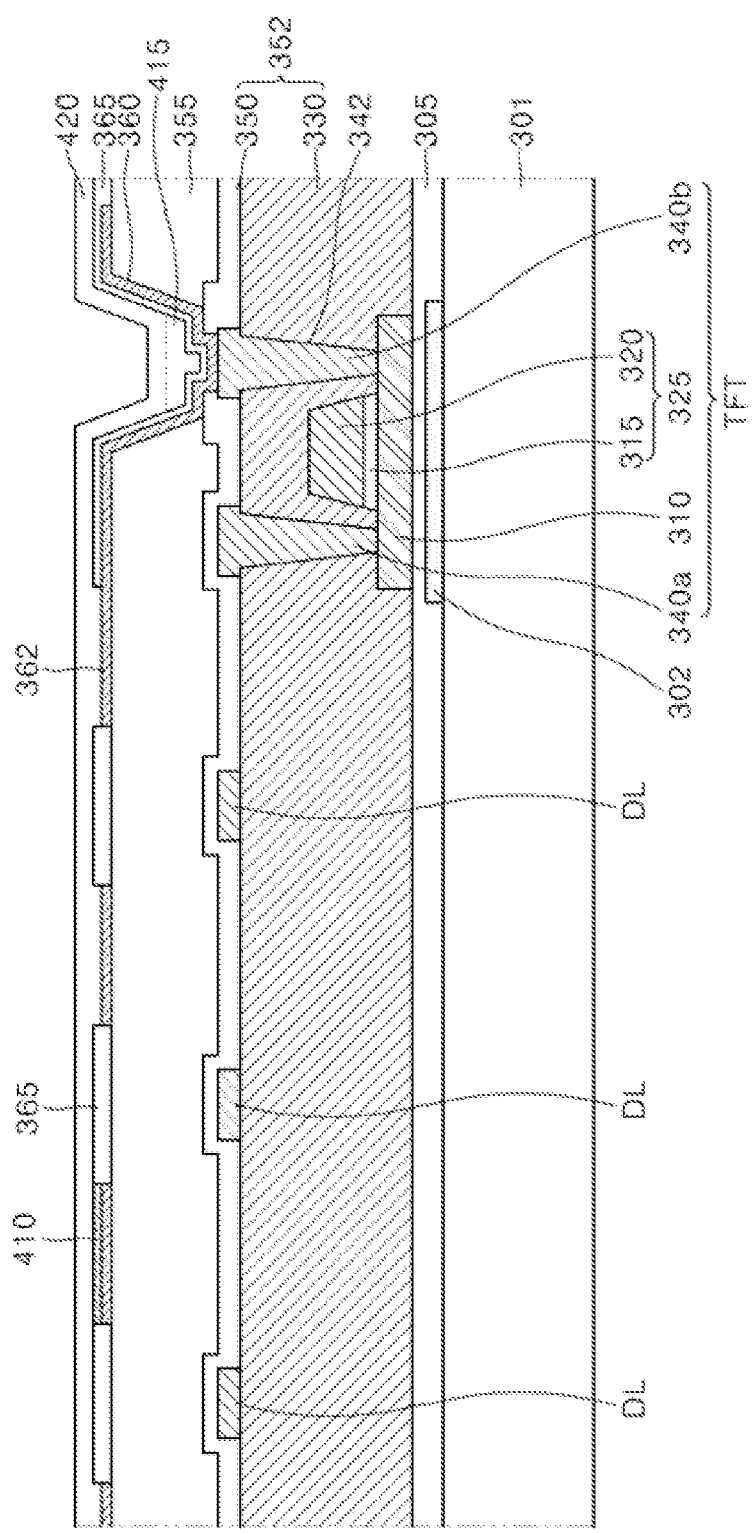

Referring to FIG. 13, a second protective layer 420 is formed over an entire surface of the substrate 301 on which the first pixel pattern 410 has been formed. The second protective layer 420 serves to prevent damage to the organic light-emitting layer to be formed later. The second protective layer 420 may be conformally formed on and along a surface of the first protective pattern 415 filling the inner space S1 of the second contact hole 360.

In one example, the second protective layer 420 may be made of a polymer material containing a large amount of fluorine (F) based on a carbon-carbon double bond. As the second protective layer 420 contains the large amount of fluorine (F), the layer 420 has orthogonality. Thus, the layer 420 may have both hydrophobic and oleophobic properties. Due to this orthogonality, the second protective layer 420 may be separated from moisture or may reject moisture and thus may block a path through which moisture permeates, thereby preventing deterioration of the characteristics of the organic light-emitting element due to moisture. Since the first protective pattern 415 and the second protective layer 420 are made of the same material, the first protective pattern 415 and the second protective layer 420 will be illustrated as a single film in following drawings.

Figure 14:
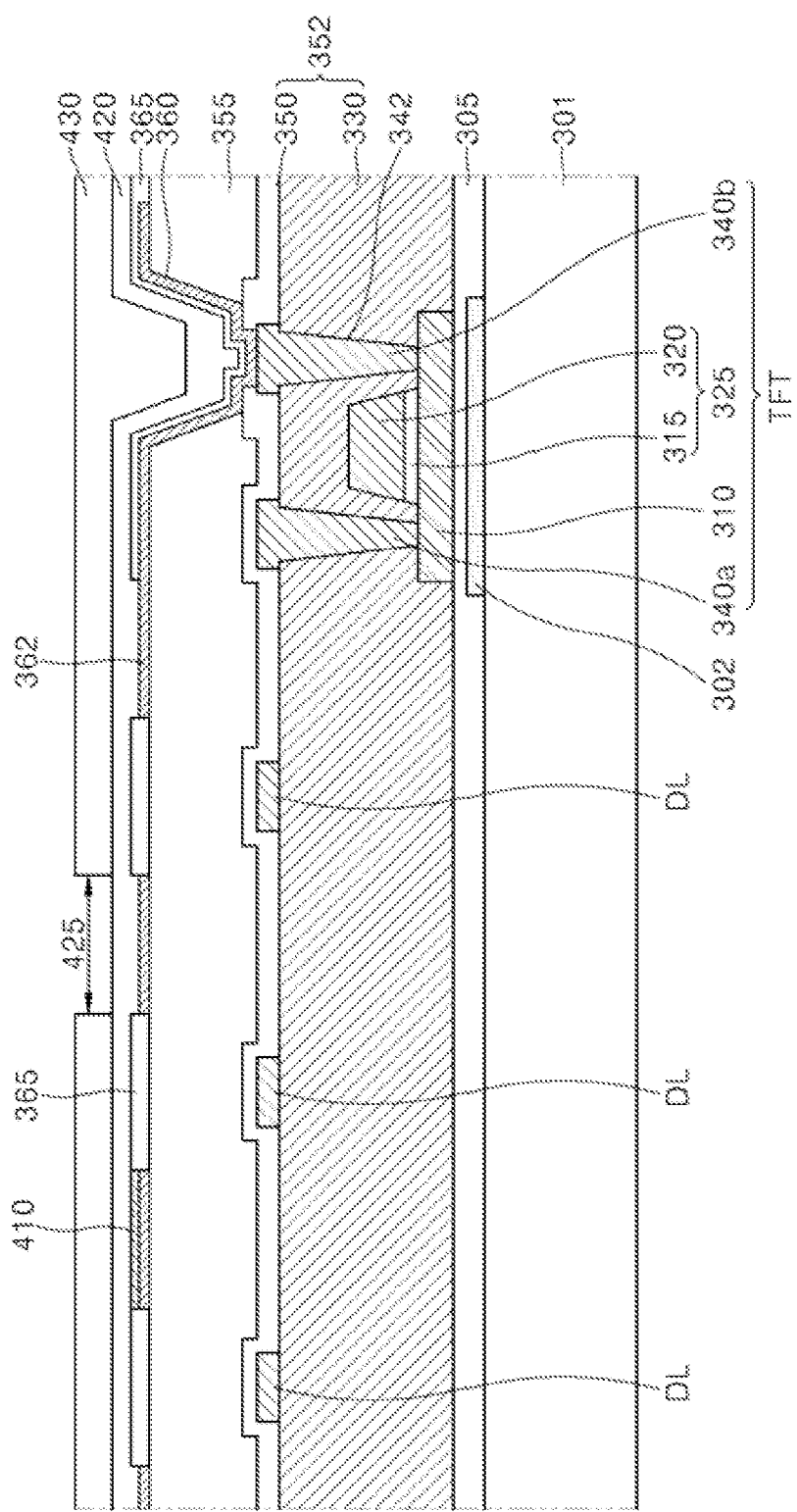

Referring to FIG. 14, a second photoresist pattern 430 having an opening area 425 defined therein defining an area where the second pixel pattern of the organic light-emitting layer is to be formed is formed over the entire surface of the substrate 301 and on the second protective layer 420. To this end, a photoresist material is applied on the second protective layer 420. The photoresist material may be applied to have a sufficient thickness such that the photoresist material fills an entirety of a remaining portion of the inner space S1 of the second contact hole 360 and covers, by a predetermined thickness, a surface of the second protective layer 420. The photoresist material may include one of a positive type photoresist material or a negative type photoresist material. In an embodiment of the present disclosure, the photoresist material may include the positive type photoresist material.

Subsequently, a remaining area except for an area where the second pixel pattern is to be formed is covered with a mask pattern (not shown), and an exposure process and a developing process are performed thereon. Thus, only an exposed portion of the photoresist material is then selectively removed to form a second photoresist pattern 430 having an opening area 425 defined therein defining an area where the second pixel pattern is to be formed. A portion of a surface of the second protective layer 420 may be exposed through the opening area 425 of the second photoresist pattern 430.

Figure 15:
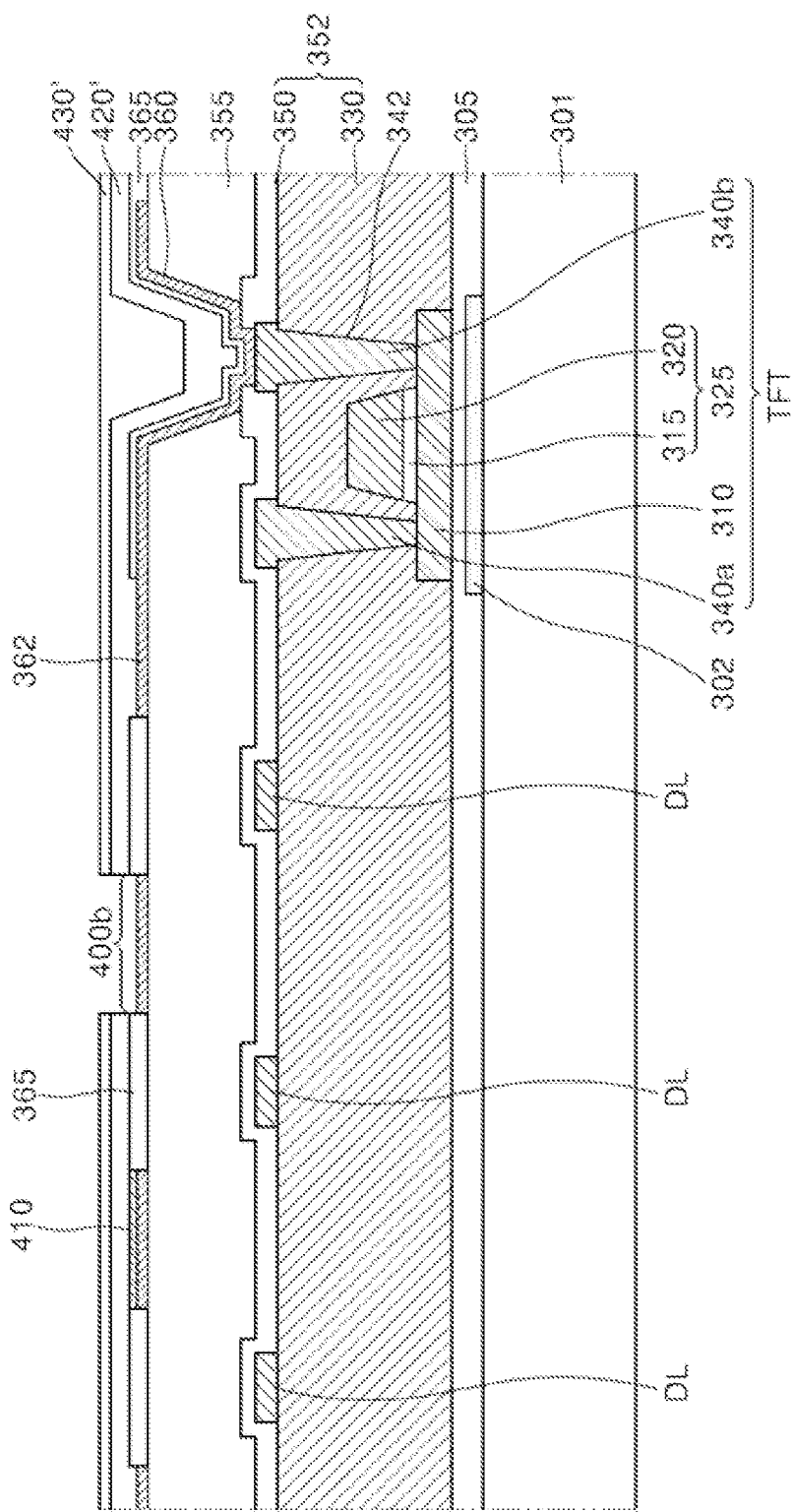

Referring to FIG. 15, the exposed portion of the second protective layer 420 is removed through the opening area 425 of the second photoresist pattern 430. The exposed portion of the second protective layer 420 may be removed by performing a dry etching process. In an embodiment of the present disclosure, in the dry etching process, a reactive gas containing sulfur hexafluoride ($SF_6$) or carbon tetrafluoride ($CF_4$) may be used as an etching gas. However, the disclosure is not limited thereto.

The second photoresist pattern 430 has a relatively higher etch rate than that of the second protective layer 420. Accordingly, after the dry etching process for removing the exposed portion of the second protective layer 420 is performed, a resulting second photoresist pattern 430' may have a thickness of 10% to 20% of an initial thickness of the second photoresist pattern 430. Further, even though the etch rate of the photoresist material is relatively higher than that of the second protective layer 420, a portion of the second photoresist pattern 430' filling the inner space S1 of the second contact hole 360 may remain in the inner space S1 of the second contact hole 360 after the dry etching process.

Under this dry etching process, a second protective layer 420' having a second opening 400b defined therein selectively exposing a surface of the first electrode 362 in the area where the second pixel pattern is to be formed may be formed.

After the dry etching process is performed, plasma treatment is performed to remove foreign substances or residues generated during the process. Plasma treatment may be performed using plasma into which a mixture of nitrogen and oxygen ($N_2/O_2$) is converted. In this regard, when plasma treatment is performed while a surface of the second protective layer 420' covering both side walls and the bottom of the second contact hole 360 is exposed, outgassing in which gaseous compounds are generated from the exposed surface of the second protective layer 420' may occur. Thus, the gaseous compounds may invade into a pixel pattern adjacent thereto such as the first pixel pattern 410 and cause damage thereto.

However, in an embodiment of the present disclosure, the second photoresist pattern 430' covers an entirety of the second protective layer 420', thereby minimizing the exposed surface thereof, thereby preventing the outgassing that may be induced in the plasma treatment process.

Figure 16:
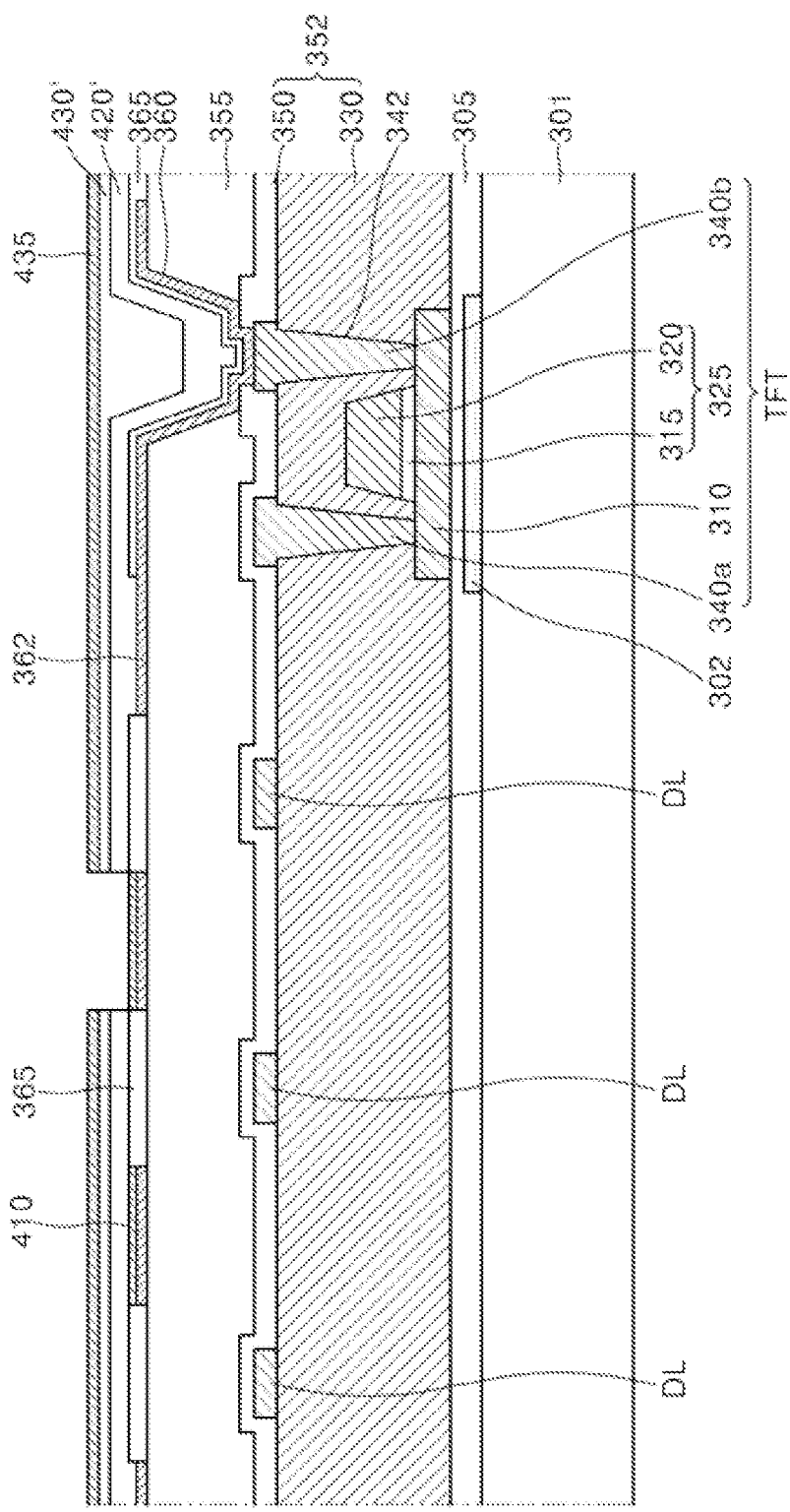

Referring to FIG. 16, a second organic light-emitting layer 435 is formed over an entirety of the substrate 301 and on the second photoresist pattern 430'. The second organic light-emitting layer 435 may be formed along and on an exposed surface of the first electrode 362 in an area 400b where the second pixel pattern is to be formed, and along and on a surface of the second photoresist pattern 430'.

Although not shown in the drawing, the second organic light-emitting layer 435 may include a stacked structure of a hole transport layer HTL, a light-emitting layer EML, and an electron transport layer ETL. Alternatively, the second organic light-emitting layer 435 may be composed of a hole transport layer HTL, a light-emitting layer EML, an electron transport layer ETL, a hole blocking layer HBL, a hole injection layer HIL, an electron blocking layer EBL and an electron injection layer EIL.

Figure 17:
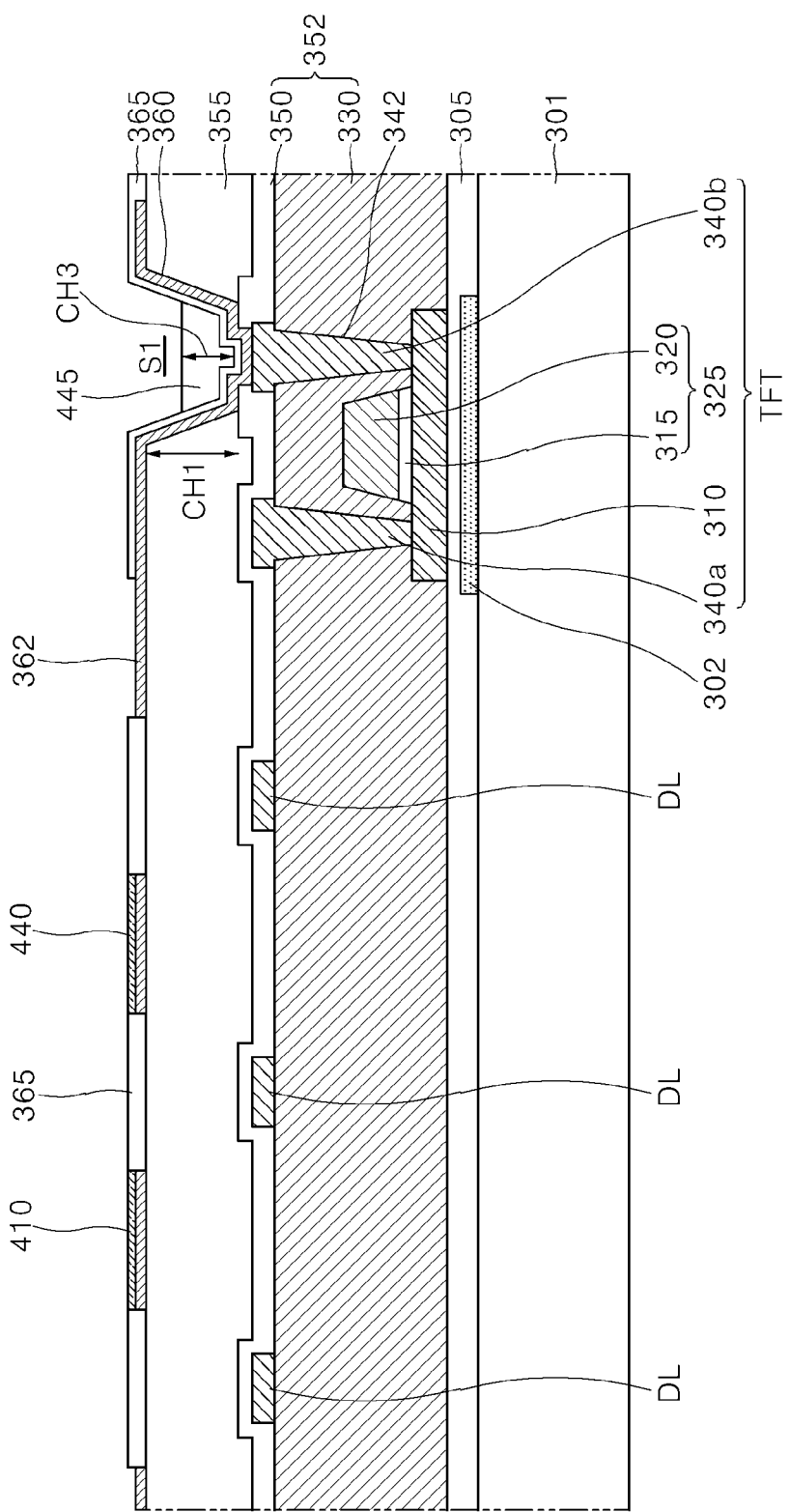

Referring to FIG. 17, a second pixel pattern 440 is formed by performing a lift-off process. The lift-off process may be performed using a fluorine (F)-based organic solvent. The fluorine (F)-based organic solvent may invade into the second protective layer 420' made of a polymer material containing a large amount of fluorine (F) and thus may selectively remove the second protective layer 420'. Then, the second photoresist pattern 430' and the second organic light-emitting layer 435 disposed on the second protective layer 420' may be removed together while the second protective layer 420' is removed.

In this regard, an organic material constituting the second pixel pattern 440 is resistant to the fluorine (F)-based organic solvent, and thus may not deteriorate or change. Accordingly, the second pixel pattern 440 may not be damaged during the lift-off process.

In one example, during the lift-off process, the fluorine (F)-based organic solvent does not invade into the second protective layer 420' disposed on the bottom of the second contact hole 360. Thus, the second protective layer 420' disposed on the bottom of the second contact hole 360 is not removed and thus may be converted into a second protective pattern 445 filling a lower portion of the second contact hole 360. As the second protective pattern 445 is formed on the first protective pattern 415 in FIG. 12, a stack of the second protective pattern 445 and the first protective pattern 415 may have a predetermined vertical dimension CH3 as a portion of a vertical dimension CH1 of the second contact hole 360.

Figure 18:
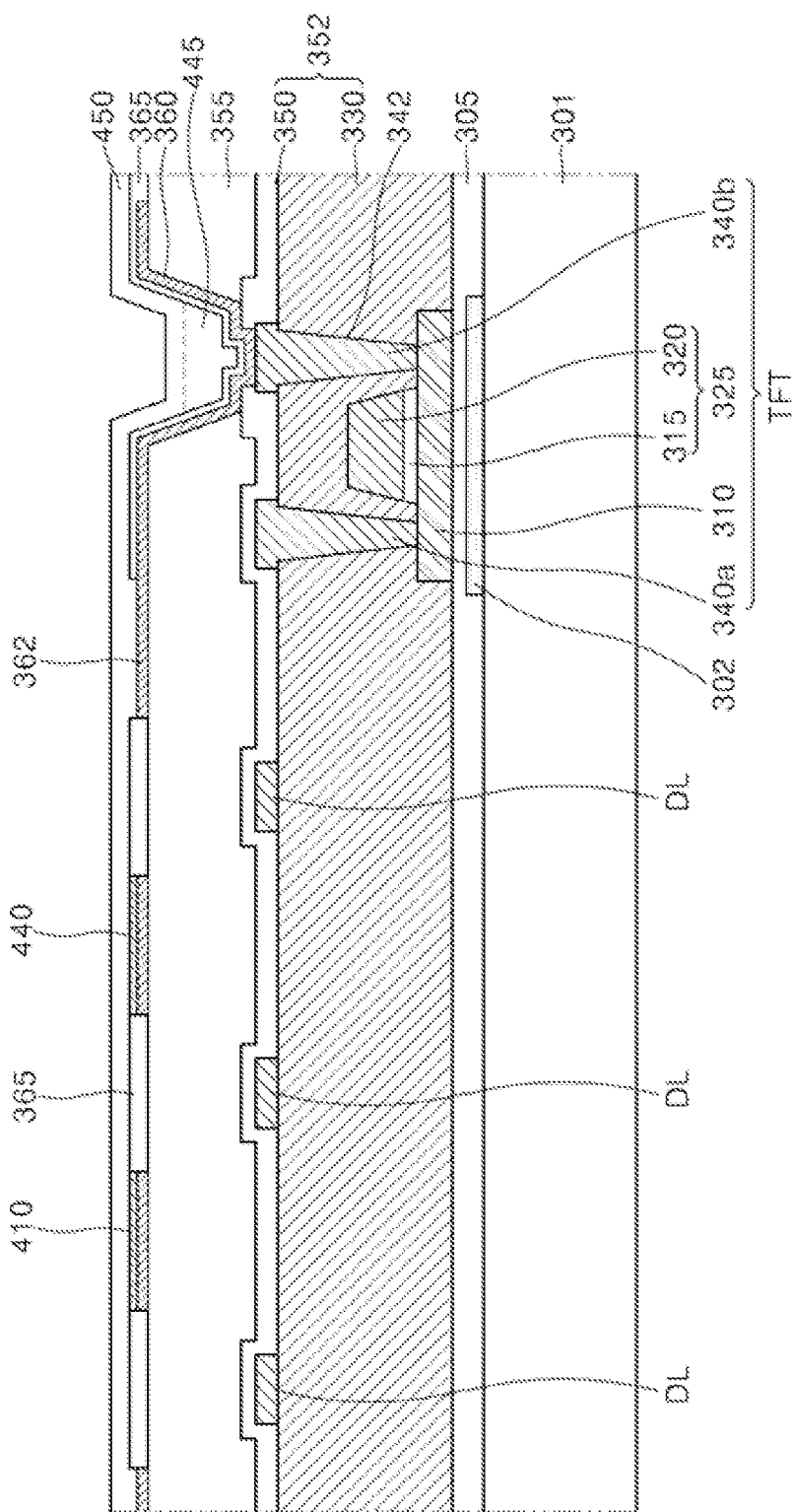

Referring to FIG. 18, a third protective layer 450 is formed over an entire surface of the substrate 301 and on the second protective pattern 445. The third protective layer 450 serves to prevent damage to the organic light-emitting layer. The third protective layer 450 may be formed to cover the exposed surfaces of the first pixel pattern 410 and the second pixel pattern 440 and cover the bank 365 that spaces the pixel patterns 410 and 440 from each other. The third protective layer 450 may be formed along and on both opposing sidewalls of the second contact hole 360 and a top surface of the second protective pattern 445. Accordingly, the third protective layer 450 may be formed to have a thickness so as to fill the inner space S1 of the second contact hole 360.

The third protective layer 450 may be made of a polymer material containing a large amount of fluorine (F) based on a carbon-carbon double bond. As the third protective layer 450 contains the large amount of fluorine (F), the third protective layer 450 has orthogonality. Thus, the third protective layer 450 may have both hydrophobic and oleophobic properties. Due to this orthogonality, the third protective layer 450 may be separated from moisture or may reject moisture and thus may block a path through which moisture permeates, thereby preventing deterioration of the characteristics of the organic light-emitting element due to moisture. Further, due to its hydrophobic and oleophobic characteristics, the third protective layer 450 is less affected by a developer containing an organic solvent used in a process step. Accordingly, deterioration of the characteristics of the organic light-emitting element due to the penetration of moisture may be suppressed. Since the second protective pattern 445 and the third protective layer 450 are made of the same material, the second protective pattern 445 and the third protective layer 450 will be illustrated as a single film in following drawings.

Figure 19:
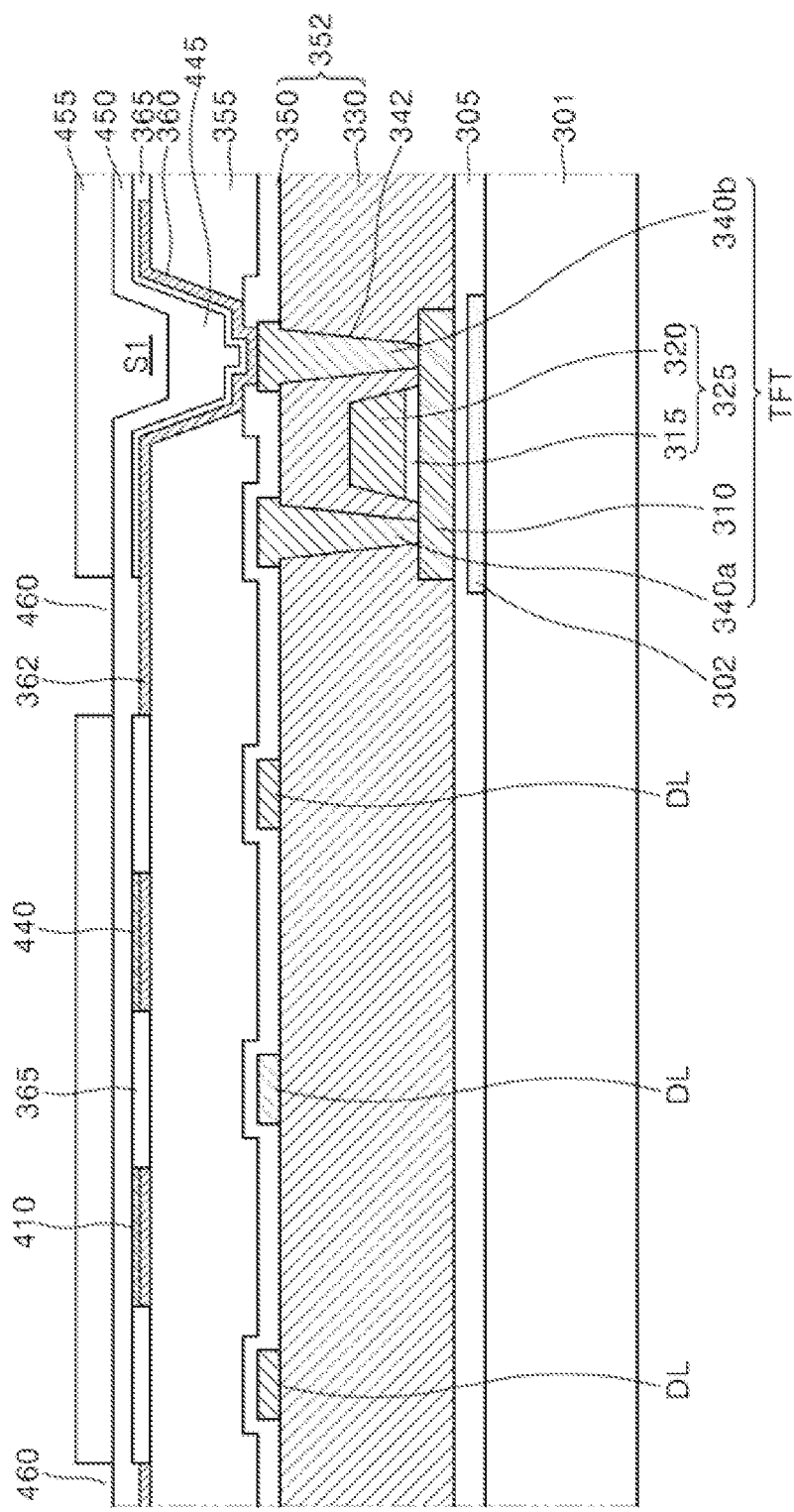

Referring to FIG. 19, a third photoresist pattern 455 having an opening area 460 defined therein defining an area where the third pixel pattern of the organic light-emitting layer is to be formed is formed over an entirety of the substrate 301. The third photoresist pattern 455 may be formed by coating a photoresist material over an entire surface of the substrate 301, and performing exposure and development processes thereon. The third photoresist pattern 455 may have a sufficient thickness such that the third photoresist pattern 455 fills an entirety of a remaining portion of the inner space S1 of the second contact hole 360 and covers, by a predetermined thickness, a surface of the third protective layer 450. In the area where the third pixel pattern of the organic light-emitting layer is to be formed, a portion of a surface of the third protective layer 450 may be exposed through the opening area 460 of the third photoresist pattern 455.

Figure 20:
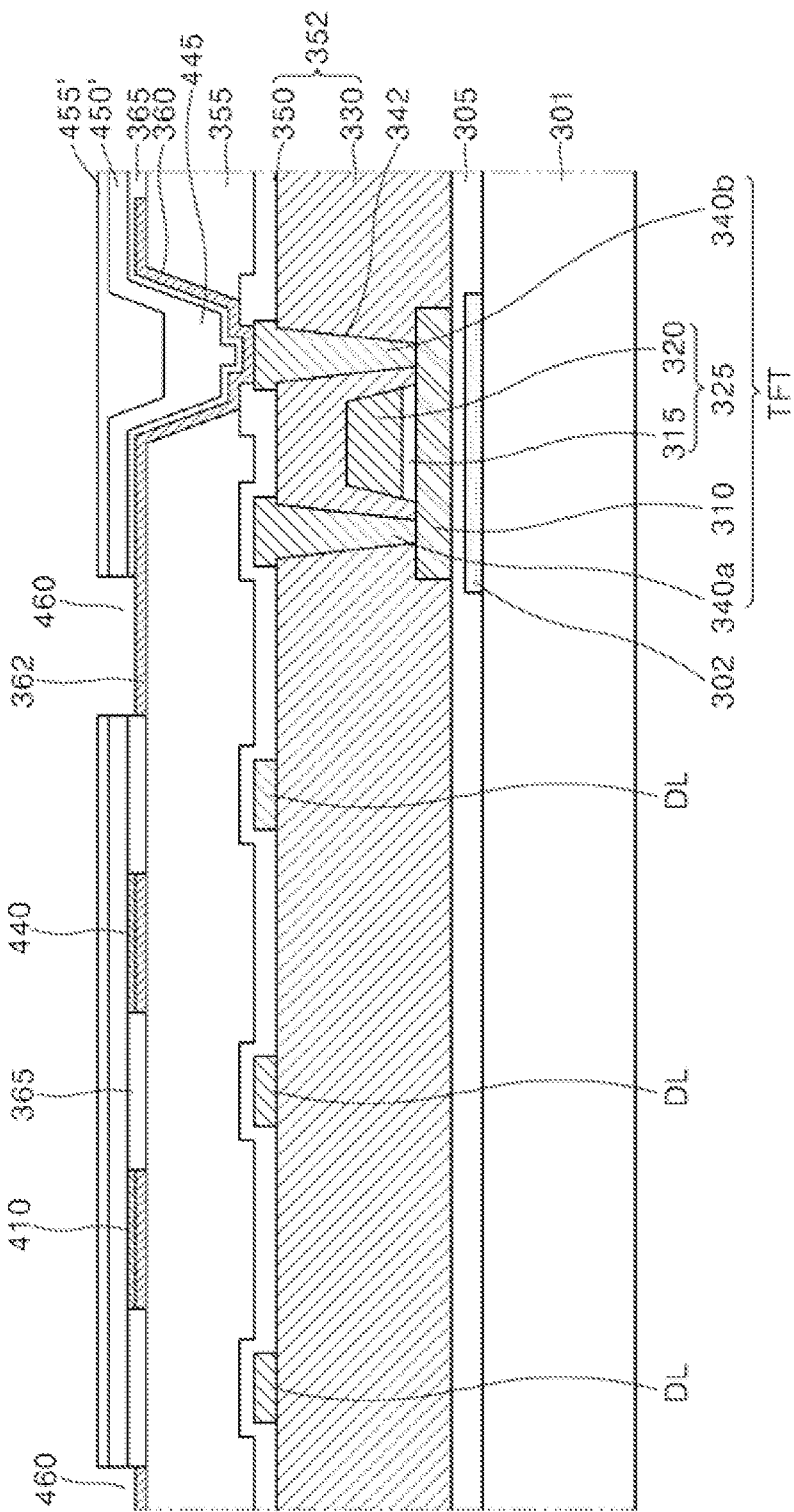

Referring to FIG. 20, the exposed portion of the third protective layer 450 is removed through the opening area of the third photoresist pattern 455 to form a third protective layer 450' having a third opening 460 defined therein exposing the first electrode 362. The exposed portion of the third protective layer 450' may be removed by performing a dry etching process. In an embodiment of the present disclosure, in the dry etching process, a reactive gas containing sulfur hexafluoride ($SF_6$) or carbon tetrafluoride ($CF_4$) may be used as an etching gas. However, the disclosure is not limited thereto.

The third photoresist pattern 455 has a relatively higher etch rate than that of the third protective layer 450'. In this regard, the third photoresist pattern 455 is formed to have a sufficient thickness to prevent excessive etching of the third protective layer 450' in the area other than the area where the third pixel pattern is to be formed. Accordingly, after the dry etching process for removing the exposed portion of the third protective layer is performed, a resulting third photoresist pattern 455' may have a thickness of 10% to 20% of an initial thickness of the third photoresist pattern 455.

Further, even though the etch rate of the photoresist material is relatively higher than that of the third protective layer, a portion of the third photoresist pattern 455' filling the inner space S1 of the second contact hole 360 may remain in the inner space S1 of the second contact hole 360 after the dry etching process.

After the dry etching process is performed, plasma treatment is performed to remove foreign substances or residues generated during the process. In one example, the plasma treatment may be performed using plasma into which a mixture of nitrogen and oxygen ($N_2/O_2$) is converted. Under this plasma treatment, foreign substances generated in the dry etching process or residues remaining in the process of performing process steps may be removed. In this regard, an entirety of the third protective pattern 450' is covered with the third photoresist pattern 455', thereby preventing outgassing during the plasma treatment.

Figure 21:
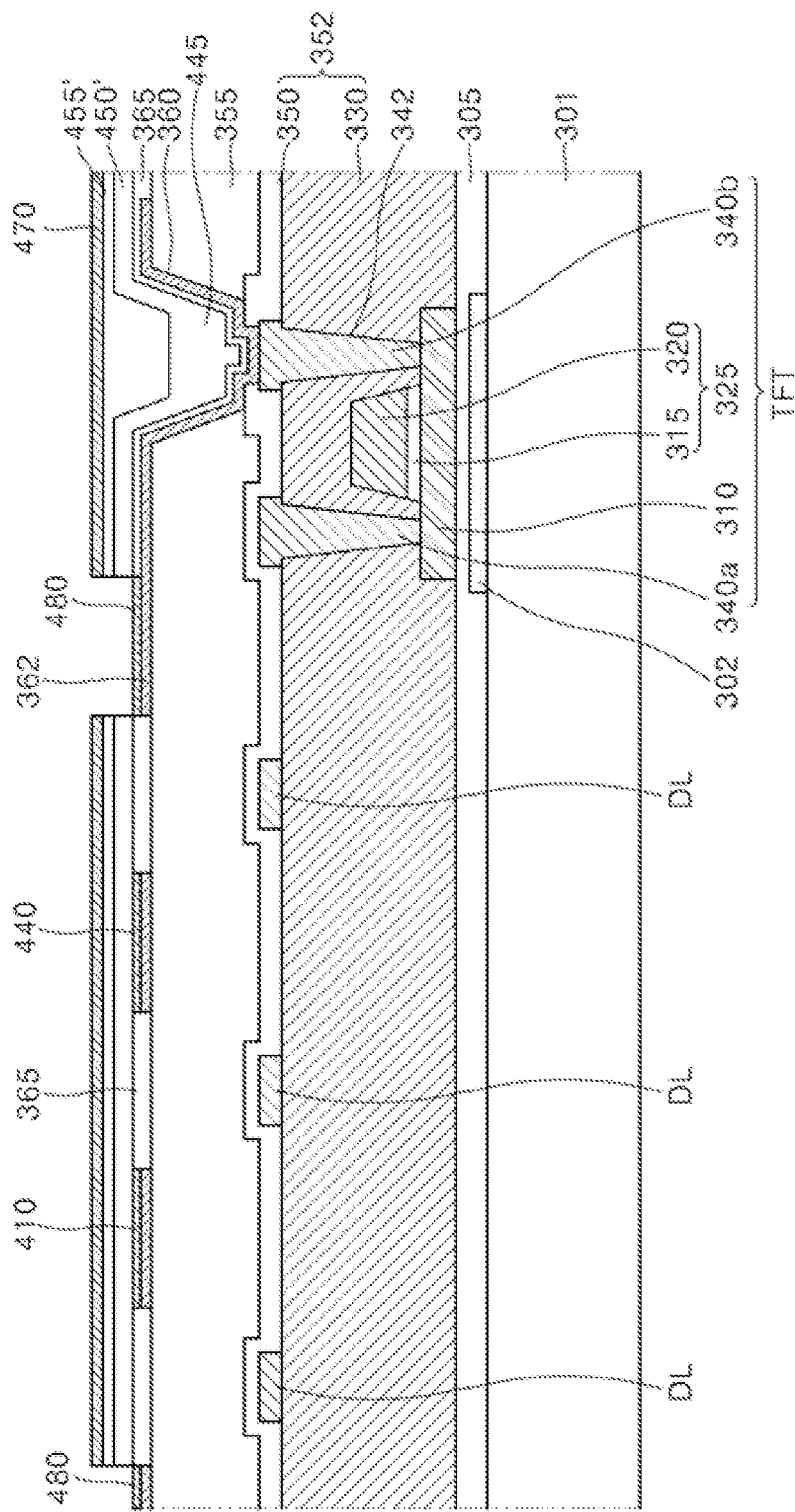

Referring to FIG. 21, a third organic light-emitting layer 470 is formed over an entirety of the substrate 301 and on the third photoresist pattern 455'. The third organic light-emitting layer 470 may be formed along and on an exposed surface of the first electrode 362 in an area 400c where the third pixel pattern is to be formed, and along and on a surface of the third photoresist pattern 455'.

Although not shown in the drawing, the third organic light-emitting layer 470 may include a stacked structure of a hole transport layer HTL, a light-emitting layer EML, and an electron transport layer ETL. Alternatively, the third organic light-emitting layer 470 may include a hole transport layer HTL, a light-emitting layer EML, an electron transport layer ETL, a hole blocking layer HBL, a hole injection layer HIL, an electron blocking layer EBL, and an electron injecting layer EIL. The light-emitting layer EML of the third organic light-emitting layer 470 emits light via recombination of holes injected from the first electrode 362 and electrons injected from the second electrode to be formed later. In an example of the present disclosure, the light-emitting layer EML may emit blue light.

Figure 22:
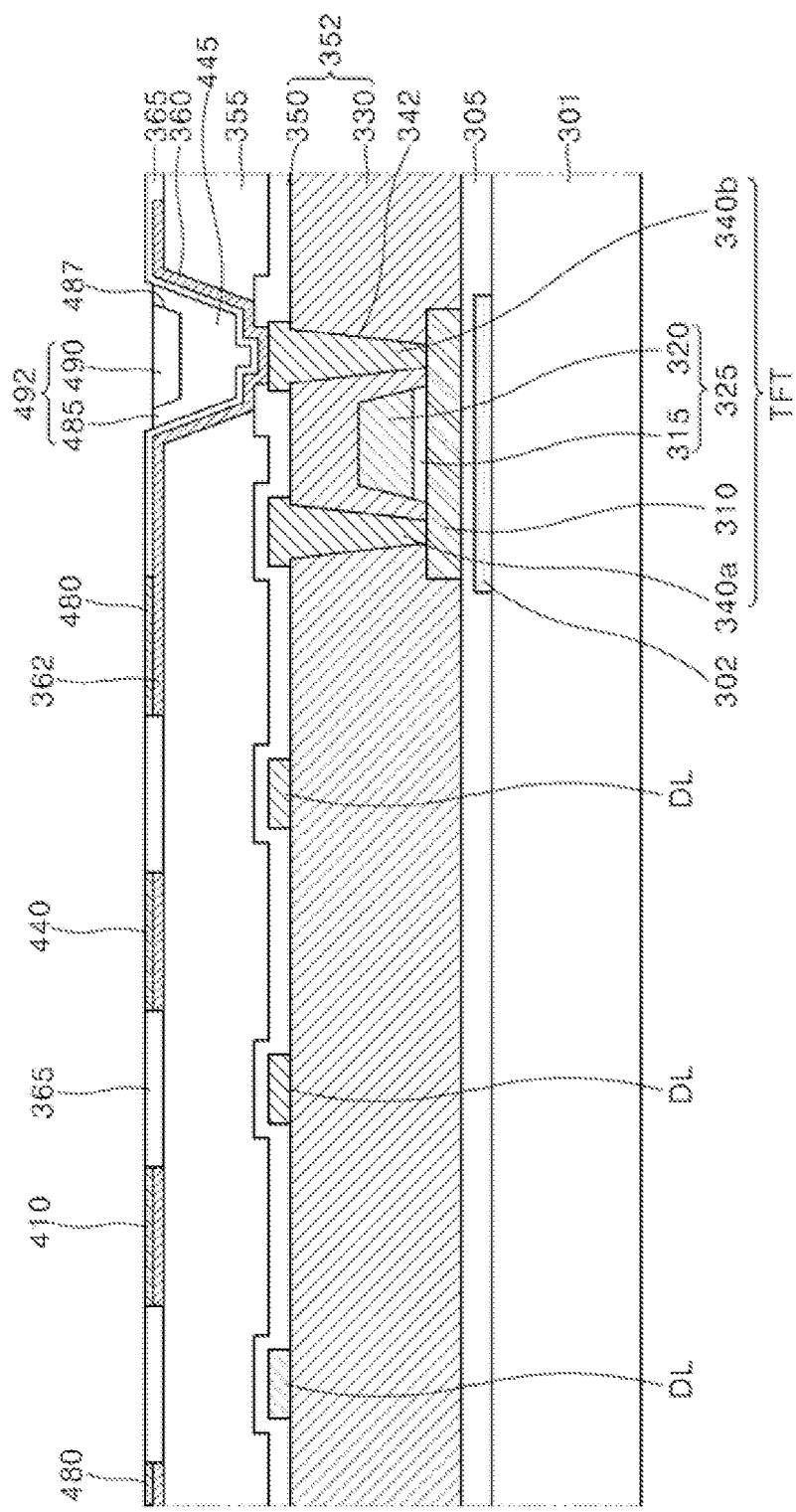

Referring to FIG. 22, a lift-off process is performed to form a third pixel pattern 480. The lift-off process may be performed using a fluorine (F)-based organic solvent. The fluorine (F)-based organic solvent may invade into the third protective layer 450' made of a polymer material containing a large amount of fluorine (F) and thus may selectively remove the third protective layer 450'. The fluorine (F)-based organic solvent may selectively act only on and remove the third protective layer 450' made of a polymer material containing the large amount of fluorine (F). As the third protective layer 450' is removed, the third photoresist pattern 455' may also be removed. Further, the third organic light-emitting layer 470 formed on the third photoresist pattern 455' may be removed during the lift-off process.

In this regard, an organic material constituting the third pixel pattern 480 is resistant to the fluorine (F)-based organic solvent, and thus may not deteriorate or change. Accordingly, the third pixel pattern 480 may not be damaged during the lift-off process.

Further, the third protective layer 450' formed in the second contact hole 360 is not removed but remains because the fluorine (F)-based organic solvent does not penetrate to the inside of the second contact hole 360. Thus, the third protective layer 450' remaining in the second contact hole 360 may be converted to a third protective pattern 485. The third protective pattern 485 may be configured to cover both opposing sidewalls of the second contact hole 360 while filling a lower portion of the inner space S1. Accordingly, the third protective pattern 485 may have a concave-shaped groove 487 recessed from a top surface thereof by a predetermined depth. In addition, a portion of the third photoresist pattern 455' in contact with the third protective pattern 485 may not be removed but remain and thus may be converted to an island pattern 490 filling the concave shape groove 487.

Accordingly, the second contact hole 360 may be entirely filled with a sealing portion 492 including the third protective pattern 485 and the island pattern 490. The island pattern 490 may be formed in a shape of an island such that an outer side surface thereof is surrounded with the third protective pattern 485 in a plan view. Further, the island pattern 490 has a plug shape so as to fill the groove 487. The sealing portion 492 may have a top surface which is positioned at a lower vertical level than that of a top surface of the bank 365.

Figure 23:
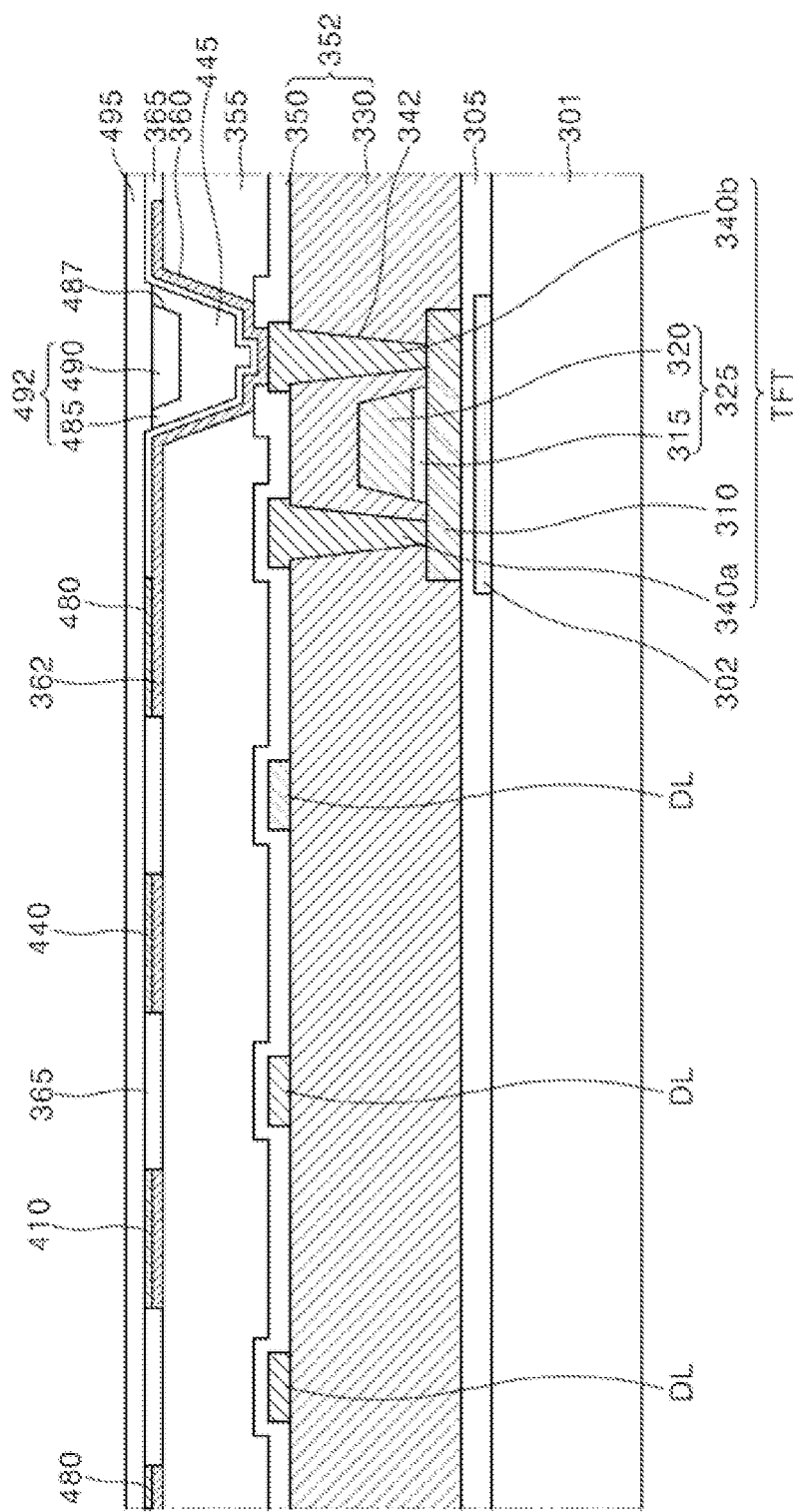

Referring to FIG. 23, a second electrode 495 is formed over an entire surface of the substrate 301. The second electrode 495 may be formed to cover a surface of the sealing portion 492 filling the second contact hole 360. The second electrode 495 may act as a common electrode commonly contacting the first pixel pattern 410, the second pixel pattern 440, and the third pixel pattern 480 for applying a common voltage thereto. The second electrode 495 may act as a cathode electrode, and supplies electrons to each of the pixel patterns 410, 440, and 480.

In one example, the second electrode 495 may be made of a light-transmissive metal oxide such as indium-tin-oxide (ITO) or indium-zinc-oxide (IZO). Alternatively, the second electrode 496 may be made of a semi-transmissive metal material including at least one of molybdenum (Mo), tungsten (W), silver (Ag), or aluminum (Al) and an alloy thereof.

Figure 24:
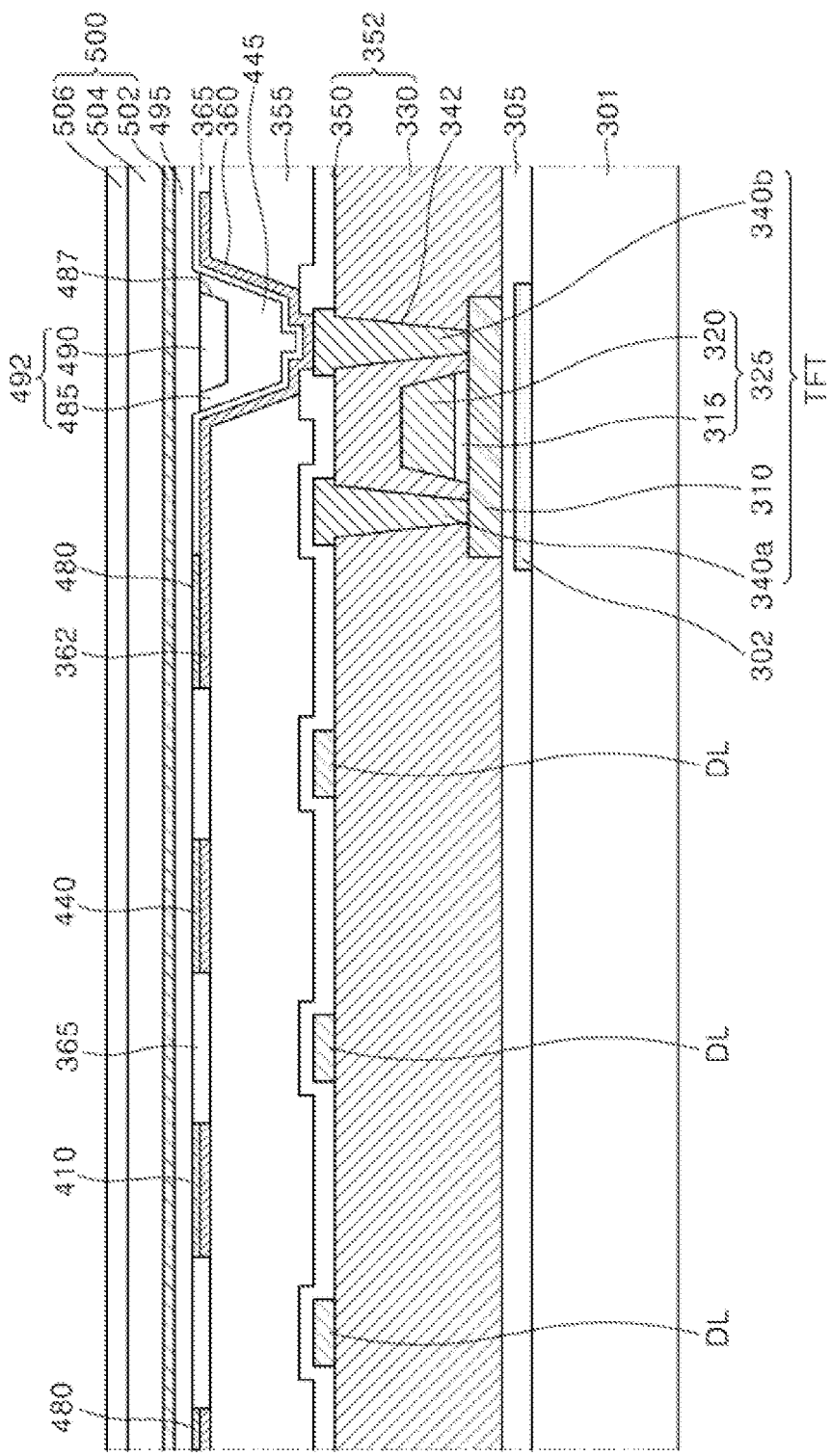

Referring to FIG. 24, an encapsulation layer 500 may be disposed on the second electrode 495. The encapsulation layer 500 may include a first encapsulation film 502, a cover film 504, and a second encapsulation film 506. The encapsulation layer 500 serves to prevent moisture, oxygen, or particles from invading into the organic light-emitting display device. The first encapsulation film 502 may include an inorganic insulating film. For example, the first encapsulation film 502 may include an inorganic insulating film made of, for example, silicon oxide ($SiO_x$), silicon nitride ($SiN_x$), aluminum oxide ($AlO_x$), or aluminum nitride ($AlN_x$).

The cover film 504 serves to prevent particles generated during the process or generated from an outside from moving in the device. The cover layer 504 may be formed to have a thickness sufficient to screen the particles in order to prevent the particles from invading into the pixel patterns 410, 440, and 480 and the second electrode 495. The cover film 504 may be made of a transparent organic material, for example, epoxy resin, polyimide resin, or acryl resin. However, the disclosure is not limited thereto.

The second encapsulation film 506 may include the same inorganic insulating film as that of the first encapsulation film 502. In one example, the second encapsulation film 506 may include at least one material among materials having high insulating ability, such as silicon oxide ($SiO_x$), silicon nitride ($SiN_x$), aluminum oxide ($AlO_x$), and aluminum nitride ($AlN_x$).

Figure 25:
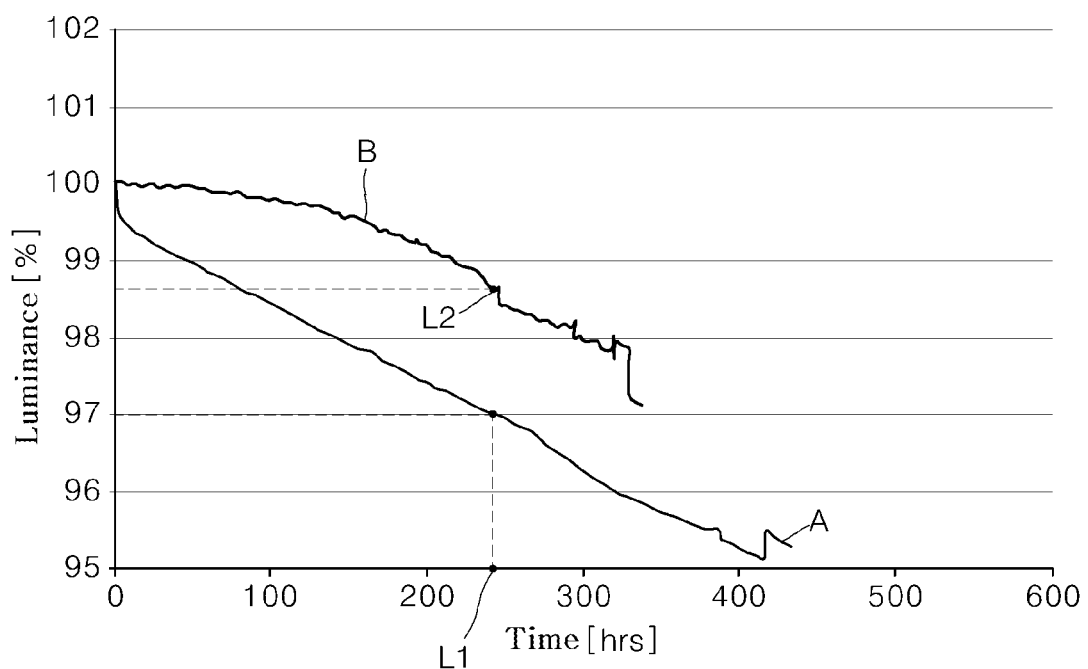
FIG. 25 is a graph showing a luminance degradation rate over time in an organic light-emitting display device manufactured by each of Present Example 1 and Comparative Example 1.

FIG. 25 is a graph showing the luminance degradation rate over time in an organic light-emitting display device manufactured by each of Present Example 1 (also referred to as Present Example (B)) and Comparative Example 1 (also referred to as Comparative Example (A)).

Referring to FIG. 25, when a process step is carried out using the protective layer as a single layer in Comparative Example (A), a slope at which the luminance decreases over time is relatively larger. Thus, the luminance decreases to 97% before 300 hours (L1). In other words, it may be identified that a reduction period at which the luminance decreases is shortened due to the outgassing induced in the plasma treatment process during the patterning process. In contrast thereto, it may be identified that in Present Example (B) according to an embodiment of the present disclosure in which the protective layer is covered with the photoresist material, the luminance decreases to a value below 99% after 200 hours (L2). Accordingly, it may be identified that, when the process is performed while the protective layer is covered with a photoresist material, the outgassing phenomenon is reduced or suppressed even when plasma treatment is performed, thereby improving the lifespan of the organic light-emitting display device.

Although the embodiments of the present disclosure have been described in more detail with reference to the accompanying drawings, the present disclosure is not necessarily limited to these embodiments. The present disclosure may be implemented in various modified manners within the scope not departing from the technical idea of the present disclosure. Accordingly, the embodiments disclosed in the present disclosure are not intended to limit the technical idea of the present disclosure, but to describe the present disclosure. The scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. An organic light-emitting display device comprising:
    a substrate;
    a driving thin-film transistor disposed on the substrate and including a source electrode and a drain electrode;
    an insulating film disposed on the driving thin-film transistor and receiving therein a first contact hole, wherein the drain electrode fills the first contact hole;
    a planarization layer disposed on the insulating film and receiving therein a second contact hole exposing a portion of the drain electrode;
    a first electrode disposed on the planarization layer, wherein the first electrode is connected to the drain electrode;
    a bank disposed on the planarization layer so as to define a light-emitting area of each pixel;
    a plurality of pixel patterns respectively disposed on the first electrode; and
    a sealing portion disposed in the second contact hole, wherein the sealing portion includes:
        a protective pattern partially filling an inner space of the second contact hole; and
        an island pattern disposed on a top portion of the protective pattern.

2. The organic light-emitting display device of claim 1, wherein the bank further includes a first bank
    disposed between the sealing portion and a portion of the first electrode extending along and, on a sidewall and a bottom of the second contact hole, and a second bank disposed between adjacent pixel patterns,
    wherein the first bank and the second bank are comprised of an inorganic insulating film, and
    wherein a thickness of the first bank is less than a thickness of the second bank.

3. The organic light-emitting display device of claim 2, wherein the bank is comprised of an inorganic insulating film including silicon oxide or silicon nitride.

4. The organic light-emitting display device of claim 1, wherein the protective pattern includes a fluorinated polymer material based on a carbon-carbon double bond so as to have orthogonality.

5. The organic light-emitting display device of claim 1, wherein the plurality of pixel patterns include a first pixel pattern, a second pixel pattern and a third pixel pattern for emitting light beams of red, green, and blue colors, respectively.

6. The organic light-emitting display device of claim 1, wherein the protective pattern has a groove having a concave shape defined in a top portion thereof while partially filling both sidewalls and bottom portions of the second contact hole, wherein the island pattern fills the groove and has a plug shape.

7. The organic light-emitting display device of claim 1, wherein an outer side surface of the island pattern is surrounded with the protective pattern.

8. The organic light-emitting display device of claim 1, wherein the island pattern includes a photoresist material.

9. The organic light-emitting display device of claim 1, wherein a top surface of the sealing portion has a vertical level lower than a vertical level of a top surface of the bank.

10. The organic light-emitting display device of claim 1, wherein a top surface of the bank is coplanar with a top surface of the plurality of pixel patterns.

11. An organic light-emitting display device comprising:
    a driving thin-film transistor including a source electrode and a drain electrode;
    an insulating film disposed on the driving thin-film transistor and having a first contact hole defined therein, wherein the drain electrode and source electrode extend through the first contact hole;
    a planarization layer disposed on the insulating film and having a second contact hole defined therein;
    a first electrode disposed on the planarization layer, wherein the first electrode is connected to the drain electrode or the source electrode via the second contact hole;
    a bank disposed on the planarization layer so as to define a light-emitting area of each pixel; and a sealing portion disposed in the second contact hole, wherein the sealing portion includes:
a protective pattern partially filling an inner space of the second contact hole; and
an island pattern disposed on a top portion of the protective pattern.

12. The organic light-emitting display device of claim 11, wherein the bank is formed of an inorganic insulating material.

* * * * *